(12) United States Patent
Kakamu

(10) Patent No.: US 10,944,042 B2
(45) Date of Patent: *Mar. 9, 2021

(54) PIEZOELECTRIC ACTUATOR AND METHOD FOR MANUFACTURING PIEZOELECTRIC ACTUATOR

(71) Applicant: BROTHER KOGYO KABUSHIKI KAISHA, Nagoya (JP)

(72) Inventor: Katsumi Kakamu, Kuwana (JP)

(73) Assignee: BROTHER KOGYO KABUSHIKI KAISHA, Aichi-ken (JP)

(*) Notice: Subject to any disclaimer, the term of this patent is extended or adjusted under 35 U.S.C. 154(b) by 262 days.

This patent is subject to a terminal disclaimer.

(21) Appl. No.: 16/231,007

(22) Filed: Dec. 21, 2018

(65) Prior Publication Data

US 2019/0123260 A1 Apr. 25, 2019

Related U.S. Application Data

(63) Continuation of application No. 14/844,233, filed on Sep. 3, 2015, now Pat. No. 10,205,086.

(30) Foreign Application Priority Data

Sep. 26, 2014 (JP) .................................. 2014-197243

(51) Int. Cl.
*H01L 41/09* (2006.01)
*H01L 41/04* (2006.01)
(Continued)

(52) U.S. Cl.
CPC .......... *H01L 41/31* (2013.01); *B41J 2/14233* (2013.01); *B41J 2/161* (2013.01); *B41J 2/1623* (2013.01);
(Continued)

(58) Field of Classification Search
CPC ............. H01L 41/0475; H01L 41/0973; H01L 41/14233
(Continued)

(56) References Cited

U.S. PATENT DOCUMENTS 6,172,446 B1  1/2001  Kanayama et al.
7,239,070 B2  7/2007  Shimada et al.
(Continued)

FOREIGN PATENT DOCUMENTS

CN     102431303      5/2012
JP     2003-529943   10/2003
(Continued)

OTHER PUBLICATIONS

Extended European Search Report for EP Patent Application No. 15 184 548.4 dated Feb. 29, 2016.
(Continued)

*Primary Examiner* — Derek J Rosenau
(74) *Attorney, Agent, or Firm* — Haug Partners LLP

(57) ABSTRACT

A piezoelectric actuator includes a substrate, a first electrode arranged on the substrate, a piezoelectric body stacked on the first electrode, a second electrode superimposed on a surface of the piezoelectric body on a side opposite to the first electrode, and a wiring connected to the first electrode. The first electrode has a connecting portion which is arranged to protrude from an end portion of the piezoelectric body and to which the wiring is connected, and a first conductive portion is provided so that the first conductive portion overlaps with the first electrode while extending over from an area overlapped with the end portion of the piezoelectric body up to the connecting portion of the first electrode.

18 Claims, 15 Drawing Sheets

(51) Int. Cl.
  *H01L 41/31* (2013.01)
  *B41J 2/14* (2006.01)
  *B41J 2/16* (2006.01)
  *H01L 41/047* (2006.01)
  *H01L 41/29* (2013.01)

(52) U.S. Cl.
  CPC ........... *B41J 2/1628* (2013.01); *B41J 2/1646* (2013.01); *H01L 41/0475* (2013.01); *H01L 41/0973* (2013.01); *H01L 41/29* (2013.01); *B41J 2002/14491* (2013.01)

(58) Field of Classification Search
  USPC ....................................................... 310/324
  See application file for complete search history.

(56) References Cited

U.S. PATENT DOCUMENTS

| | | |
|---|---|---|
| 2003/0178917 A1 | 9/2003 | Hofmann et al. |
| 2009/0244208 A1 | 10/2009 | Shimada |
| 2011/0234708 A1 | 9/2011 | Nakayama et al. |
| 2012/0030915 A1 | 2/2012 | Shimizu et al. |
| 2012/0062658 A1 | 3/2012 | Koseki |
| 2013/0265370 A1 | 10/2013 | Nagahata |
| 2014/0063129 A1 | 3/2014 | Kondo |
| 2014/0267510 A1 | 9/2014 | Furuya |

FOREIGN PATENT DOCUMENTS

| | | |
|---|---|---|
| JP | 2009-255532 | 11/2009 |
| JP | 2011/201264 | 10/2011 |
| JP | 2012-119386 | 1/2012 |
| JP | 2012-038808 | 2/2012 |
| JP | 2013-016738 | 1/2013 |
| JP | 2013-111819 | 6/2013 |
| JP | 2013-215930 | 10/2013 |
| JP | 2014-013843 | 1/2014 |

OTHER PUBLICATIONS

Notification of First Office Action for Chinese Application No. 201510542265.9 dated Aug. 30, 2016.
Notice of Reasons for Rejection for Japanese Patent Application No. 2014-197243 dated Nov. 6, 2018.
Notice of Reasons for Rejection for JP Application No. 2014-197243 dated May 8, 2018.

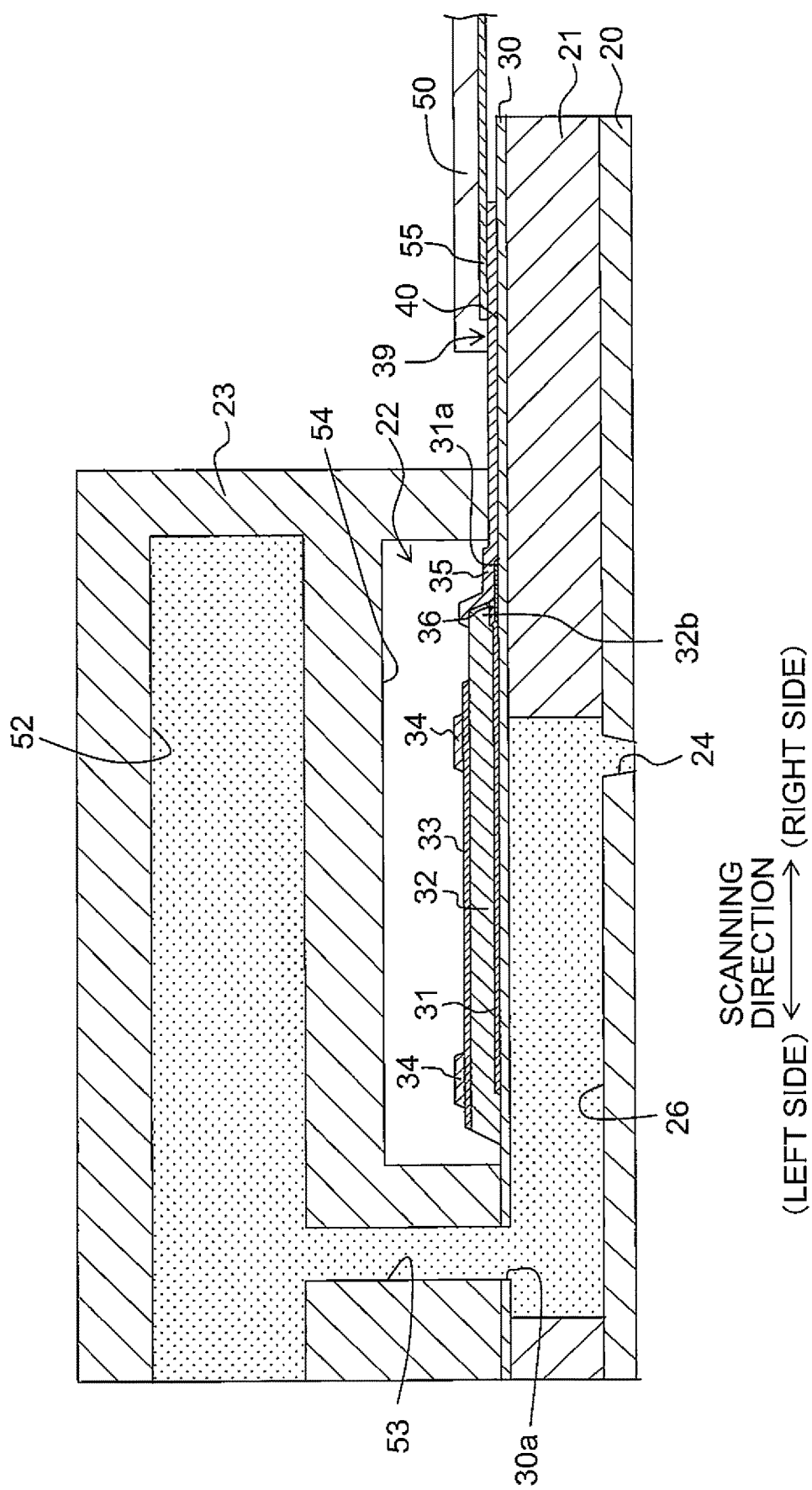

PIEZOELECTRIC ACTUATOR AND METHOD FOR MANUFACTURING PIEZOELECTRIC ACTUATOR

CROSS REFERENCE TO RELATED APPLICATION

The present application is a continuation of U.S. patent application Ser. No. 14/844,233 filed on Sep. 3, 2015, which claims priority from Japanese Patent Application No. 2014-197243 filed on Sep. 26, 2014, the disclosures of which are incorporated herein by reference in their entirety.

BACKGROUND

Field of the Invention

The present teaching relates to a piezoelectric actuator and a method for manufacturing the piezoelectric actuator.

Description of the Related Art

Japanese Patent Application Laid-open No. 2013-111819 discloses a piezoelectric actuator which is provided to discharge the ink from nozzles of a recording head based on the ink-jet system. The piezoelectric actuator is arranged on a flow passage forming substrate composed of silicon which is formed with a plurality of pressure chambers. Note that the plurality of pressure chambers are communicated respectively with the plurality of nozzles of a nozzle plate joined to the flow passage forming substrate.

The piezoelectric actuator is provided with a plurality of piezoelectric elements which correspond to the plurality of pressure chambers respectively. The plurality of piezoelectric elements is arranged opposingly to the plurality of pressure chambers respectively on an elastic film of the flow passage forming substrate which covers the plurality of pressure chambers. Each of the piezoelectric elements has a lower electrode film, a piezoelectric body, and an upper electrode film which are stacked in this order from the side of the flow passage forming substrate. The lower electrode film is an individual electrode which is provided individually for each of the piezoelectric bodies. A wiring (lead electrode) is connected to a portion of the lower electrode film which is exposed while protruding from the piezoelectric body. On the other hand, the upper electrode films are in conduction with each other among the plurality of piezoelectric elements, and the upper electrode film functions as a common electrode. When a voltage is applied between the lower electrode film and the upper electrode film in each of the piezoelectric elements, then the deformation occurs in the piezoelectric body, and thus the pressure of the ink contained in the pressure chamber is raised. Accordingly, the ink is discharged from the nozzle which is communicated with the pressure chamber.

The piezoelectric actuator described above is manufactured by performing the following steps. At first, an electrode film is formed as a film on the elastic film of the flow passage forming substrate, for example, by means of the sputtering method. The patterning is performed for the electrode film to form the plurality of lower electrode films. Subsequently, a piezoelectric material film is formed as a film on the substantially entire surface of the elastic film formed with the plurality of lower electrode films. After that, the piezoelectric material film is subjected to the patterning to form the plurality of piezoelectric bodies which cover the plurality of lower electrode films respectively. Subsequently, an electrode film is formed as a film to cover the plurality of piezoelectric bodies, and then the electrode film is subjected to the patterning to form the upper electrode film.

SUMMARY

As described above, the piezoelectric material film is formed as the film on the entire surface of the elastic film, and then unnecessary portions of the piezoelectric material film are removed by means of the etching to perform the patterning in the piezoelectric body forming step included in the manufacturing of the piezoelectric actuator. However, it is feared that a part of the lower electrode film, which is arranged on the lower side of the piezoelectric material film, may be removed together when the etching is performed for the piezoelectric material film. In particular, if the portion of the lower electrode film, which is to be connected to the wiring (lead electrode), is scraped off, the reliability of the electric connection is lowered between the lower electrode film and the wiring.

An object of the present teaching is to avoid the deterioration of the reliability of the electric connection between an electrode and a wiring on account of the simultaneous removal of the electrode disposed on the lower side when a piezoelectric body is formed by means of the patterning.

According to a first aspect of the present teaching, there is provided a piezoelectric actuator including a substrate; a first electrode arranged on the substrate; a piezoelectric body stacked on the first electrode; a second electrode superimposed on a surface of the piezoelectric body on a side opposite to the first electrode; and a wiring connected to the first electrode, wherein the first electrode has a connecting portion which is arranged to protrude from an end portion of the piezoelectric body and to which the wiring is connected, and a first conductive portion is provided so that the first conductive portion overlaps with the first electrode while extending over from an area overlapped with the end portion of the piezoelectric body up to the connecting portion of the first electrode.

In the present teaching, the first conductive portion overlaps with the first electrode so that the first conductive portion extends over from the area of the first electrode overlapped with the end portion of the piezoelectric body to the connecting portion protruding from the end portion of the piezoelectric body. Note that the first conductive portion may be arranged on the upper side of the first electrode, or the first conductive portion may be arranged on the lower side of the first electrode. When the first conductive portion covers the first electrode, the simultaneous removal of the first electrode is suppressed by the first conductive portion during the etching for the piezoelectric material film when the piezoelectric body is formed. On the other hand, when the first conductive portion is disposed on the lower side of the first electrode, the electrical connection is maintained between the connecting portion of the first electrode and the wiring, even when a part of the first electrode is removed during the etching for the piezoelectric material film, because the first conductive portion still exists thereunder.

According to a second aspect of the present teaching, there is provided a piezoelectric actuator including a substrate; a first electrode arranged on the substrate; a piezoelectric body stacked on the first electrode; a second electrode superimposed on a surface of the piezoelectric body on a side opposite to the first electrode; and a wiring connected to the first electrode, wherein a first conductive portion is provided so that the first conductive portion overlaps with the first electrode in an area overlapped with an end portion of the piezoelectric body, and at least one of the first electrode and the first conductive portion has a connecting portion which protrudes from the end portion of the piezoelectric body and to which the wiring is connected.

In the present teaching, the first electrode and the first conductive portion are arranged in an overlapped manner in the area overlapped with the end portion of the piezoelectric body. Therefore, even if the upper layer portion of the first electrode and the first conductive portion is removed during the etching for the piezoelectric material film when the piezoelectric body is formed, then the lower layer portion remains, and thus the electrical connection is maintained between the first electrode and the wiring.

According to a third aspect of the present teaching, there is provided a method for manufacturing a piezoelectric actuator provided with a substrate, a first electrode arranged on the substrate, a piezoelectric body stacked on the first electrode, a second electrode superimposed on a surface of the piezoelectric body on a side opposite to the first electrode, and a wiring connected to the first electrode, the method including: a first electrode forming step of forming the first electrode on the substrate; a first conductive portion forming step of forming a first conductive portion which overlaps with the first electrode while extending over from an area of the first electrode in which the piezoelectric body is arranged up to a connecting portion which is connected to the wiring; a piezoelectric film forming step of forming a piezoelectric material film so that the first electrode is covered therewith, after the first electrode forming step and the first conductive portion forming step; a piezoelectric film patterning step of forming the piezoelectric body by performing patterning for the piezoelectric material film by means of etching and removing a portion of the piezoelectric material film which covers the connecting portion of the first electrode; and a wiring forming step of forming the wiring to be connected to the connecting portion of the first electrode after the piezoelectric film patterning step.

The first conductive portion is superimposed on the first electrode, while extending over from the connecting portion to the portion of the first electrode at which the piezoelectric body is arranged. Therefore, in a case that the first conductive portion covers the first electrode, the first electrode is prevented from being removed together when the etching is performed for the piezoelectric material film. Further, in a case that the first conductive portion is disposed on the lower side of the first electrode, even if a part of the first electrode is removed during the etching for the piezoelectric material film, then the electrical connection is maintained between the connecting portion of the first electrode and the wiring, because the first conductive portion still exists thereunder.

BRIEF DESCRIPTION OF THE DRAWINGS

FIGS. 9A to 9C depict a part of a head unit according to a modified embodiment, wherein FIG. 9A is a top view illustrating the part of the head unit, FIG. 9B is a sectional view taken along a line IXB-IXB in FIG. 9A, and FIG. 9C is a sectional view taken along a line IXC-IXC in FIG. 9A.

FIGS. 10A to 10C depict a part of a head unit according to another modified embodiment, wherein FIG. 10A is a top view illustrating the part of the head unit, FIG. 10B depicts a sectional view taken along a line XB-XB in FIG. 10A, and FIG. 10C depicts a sectional view taken along a line XC-XC in FIG. 10A.

FIGS. 11A and 11B depict a part of a head unit according to still another modified embodiment, wherein FIG. 11A is a top view illustrating the part of the head unit, and FIG. 11B is a sectional view taken along a line XIB-XIB in FIG. 11A.

FIGS. 12A to 12C depict a part of a head unit according to still another modified embodiment, wherein FIG. 12A is a top view illustrating the part of the head unit, FIG. 12B is a sectional view taken along a line XIIB-XIIB in FIG. 12A, and FIG. 12C is a sectional view taken along a line XIIC-XIIC in FIG. 12A.

FIGS. 13A and 13B depict an upper electrode forming step according to still another modified embodiment, wherein FIG. 13A depicts a conductive film forming step, and FIG. 13B depicts a conductive film patterning step.

FIG. 16 is a sectional view illustrating a head unit according to still another modified embodiment corresponding to FIG. 4.

DESCRIPTION OF THE PREFERRED EMBODIMENTS

Figure 1:
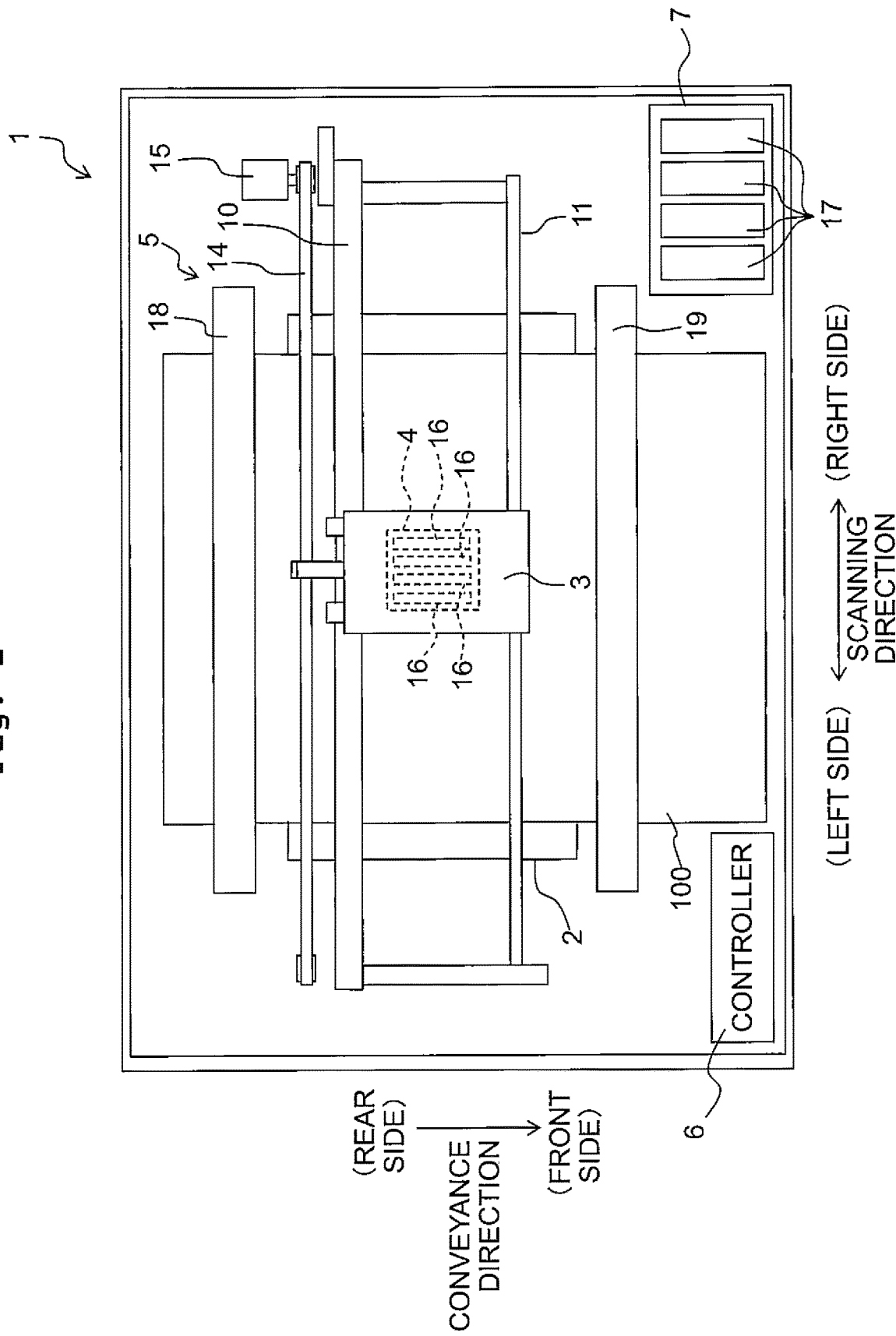
FIG. 1 is a schematic plan view illustrating a printer according to this embodiment.

Next, an embodiment of the present teaching will be explained. At first, an explanation will be made with reference to FIG. 1 about a schematic arrangement of an ink-jet printer 1. Note that the respective directions of the front, rear, left, and right depicted in FIG. 1 are defined as the "front", "rear", "left", and "right" of the printer. Further, the front side of the paper surface is defined as "upper side" or "upside", and the back side of the paper surface is defined as "lower side" or "downside". The following explanation will be made while appropriately using the terms concerning the respective directions of front, rear, left, right, upside, and downside.

<Schematic Arrangement of Printer>

As depicted in FIG. 1, the ink-jet printer 1 is provided with, for example, a platen 2, a carriage 3, an ink-jet head 4, a conveyance mechanism 5, and a controller 6.

Recording paper 100, which is the recording medium, is placed on the upper surface of the platen 2. The carriage 3 is constructed to be reciprocatively movable in the left-right direction (hereinafter referred to as "scanning direction" as well) along two guide rails 10, 11 in the area opposed to the platen 2. An endless belt 14 is connected to the carriage 3. The endless belt 14 is driven by a carriage driving motor 15, and thus the carriage 3 is moved in the scanning direction.

The ink-jet head 4 is attached to the carriage 3, and the ink-jet head 4 is movable in the scanning direction together with the carriage 3. The ink-jet head 4 is provided with four head units 16 which are aligned in the scanning direction. The four head units 16 are connected to a cartridge holder 7 to which ink cartridges 17 of four colors (black, yellow, cyan, and magenta) are installed, by means of unillustrated tubes respectively. Each of the head units 16 has a plurality of nozzles 24 (see FIGS. 2 to 4) which are formed on the lower surface thereof (surface disposed on the back side as viewed in FIG. 1). The ink, which is supplied from the ink cartridge 17, is discharged by the nozzles 24 of each of the head units 16 toward the recording paper 100 placed on the platen 2.

The conveyance mechanism 5 has two conveyance rollers 18, 19 which are arranged to interpose the platen 2 therebetween in the front-back direction. The conveyance mechanism 5 conveys the recording paper 100 placed on the platen 2 in the forward direction (hereinafter referred to as "conveyance direction" as well) by means of the two conveyance rollers 18, 19.

The controller 6 is provided with ROM (Read Only Memory), RAM (Random Access Memory), and ASIC (Application Specific Integrated Circuit) including various control circuits. The controller 6 executes various processes including, for example, the printing on the recording paper 100 by means of ASIC in accordance with programs stored in ROM. For example, in the printing process, the controller 6 prints, for example, an image on the recording paper 100 by controlling, for example, the ink-jet head 4 and the carriage driving motor 15 on the basis of the printing instruction inputted from an external apparatus such as PC or the like. Specifically, the controller 6 alternatively executes the ink discharge operation in which the inks are discharged while moving the ink-jet head 4 in the scanning direction together with the carriage 3, and the conveyance operation in which the recording paper 100 is conveyed by a predetermined amount in the conveyance direction by means of the conveyance rollers 18, 19.

<Details of Ink-Jet Head>

Next, an explanation will be made about the detailed construction of the ink-jet head 4. Note that all of the four head units 16 of the ink-jet head 4 are identically constructed. Therefore, one of them will be explained, and the other head units 16 are omitted from the explanation.

Figure 2:
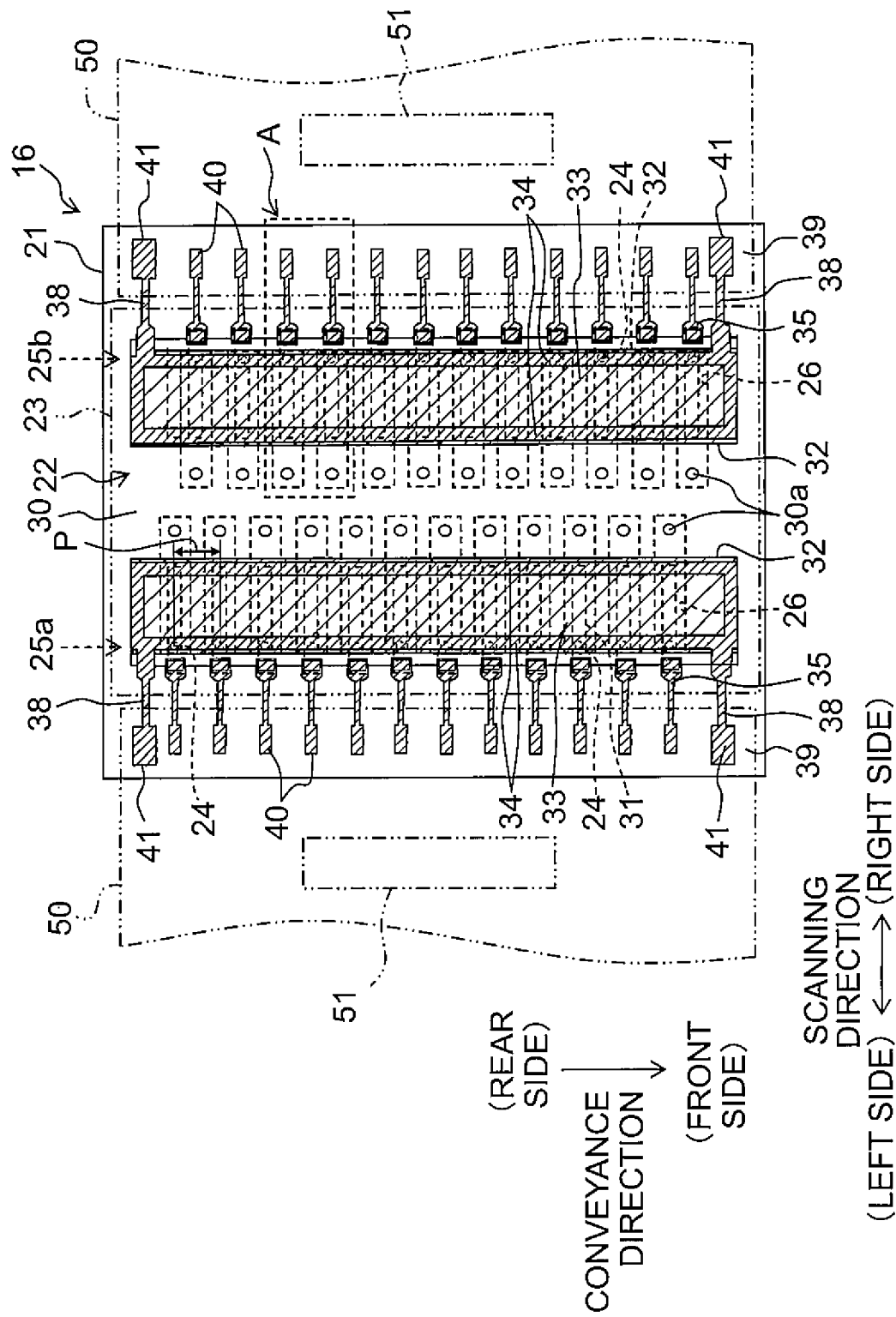
FIG. 2 is a top view illustrating one head unit of an ink-jet head.
Figure 3:
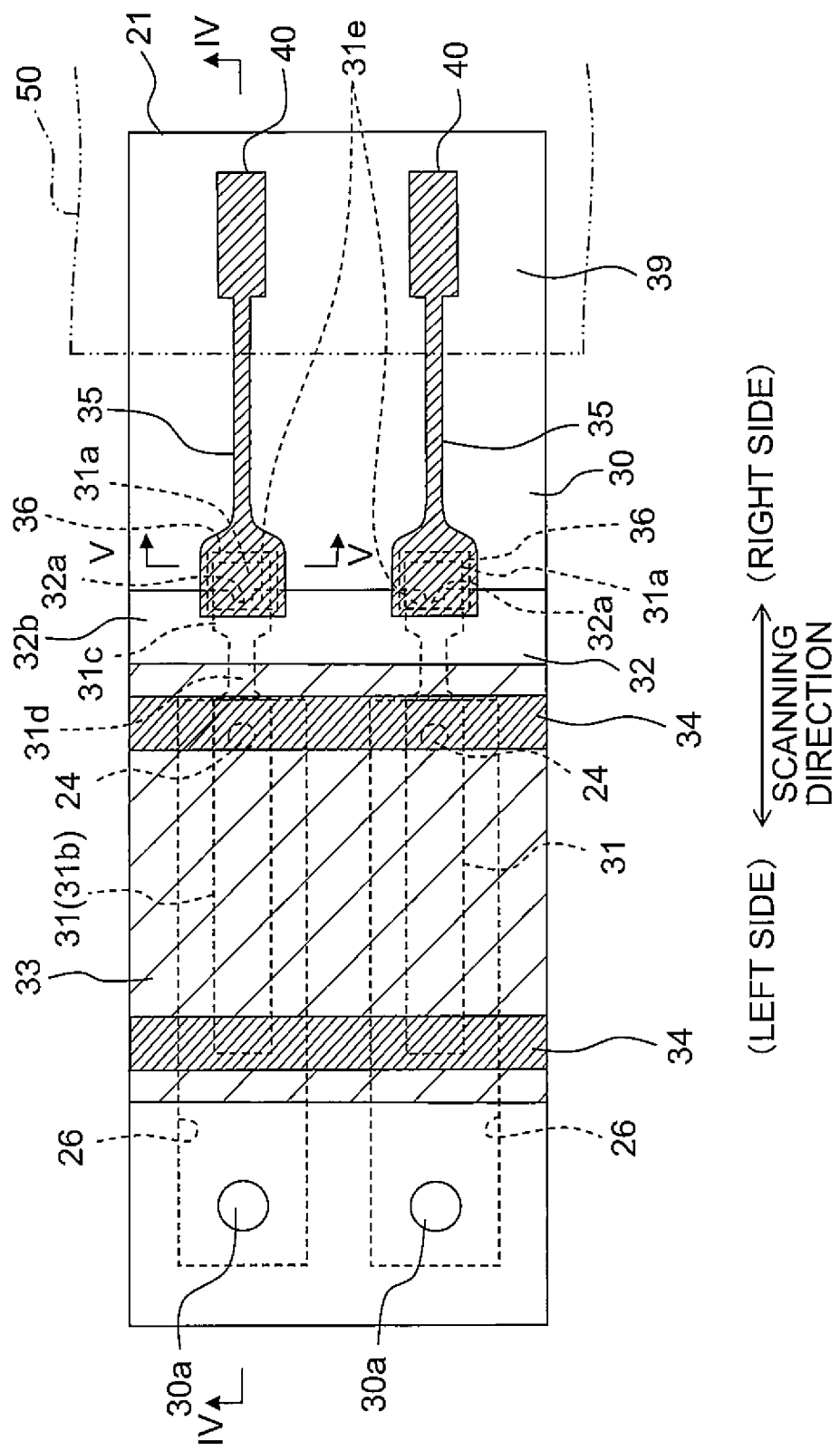
FIG. 3 is an enlarged view illustrating a portion A in FIG. 2.
Figure 4:
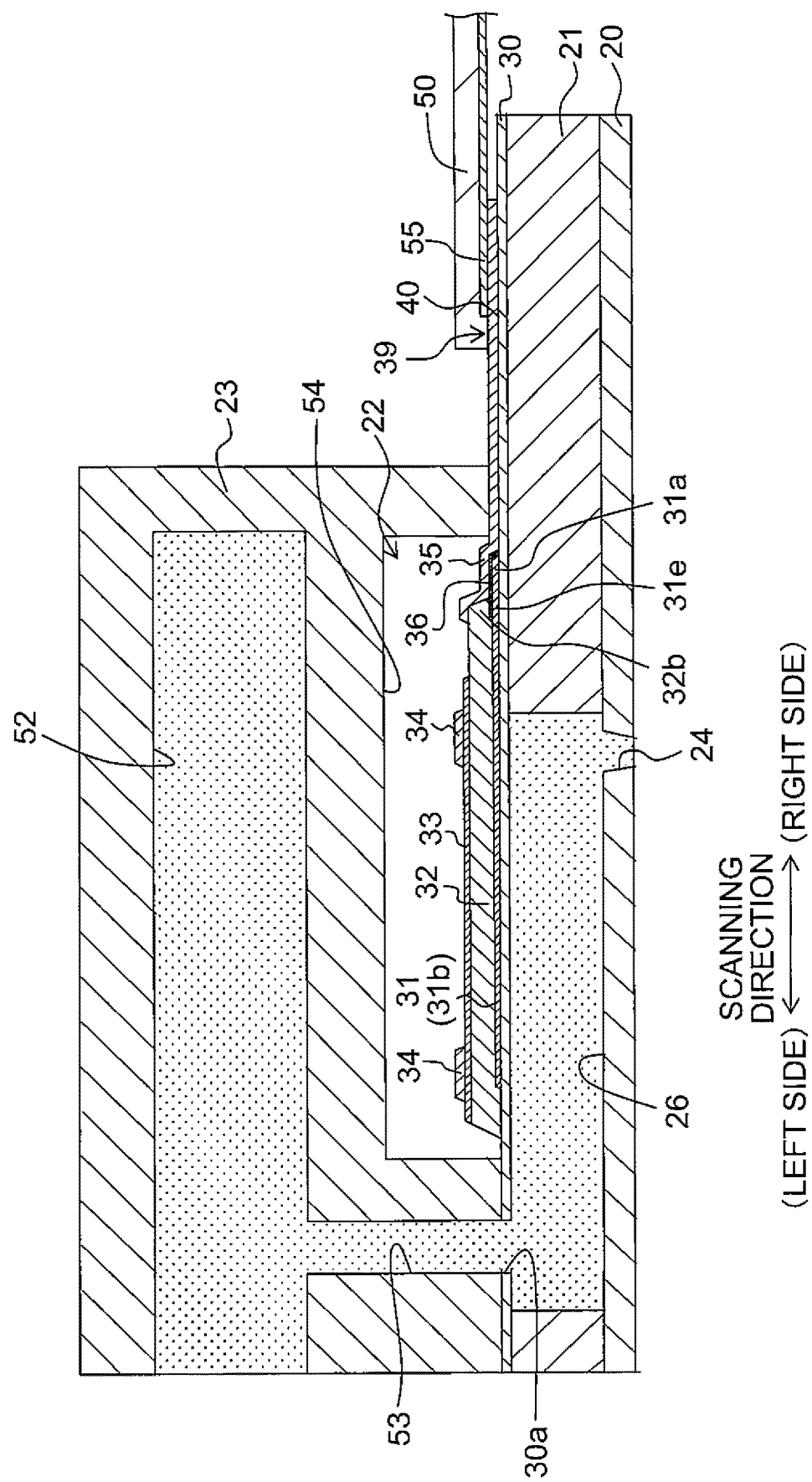
FIG. 4 is a sectional view taken along a line IV-IV in FIG. 3.

As depicted in FIGS. 2 to 4, the head unit 16 is provided with a nozzle plate 20, a flow passage forming member 21, a piezoelectric actuator 22, and a reservoir forming member 23. Note that in FIG. 2, the reservoir forming member 23, which is positioned over or above the flow passage forming member 21 and the piezoelectric actuator 22, is depicted by alternate long and two short dashes lines to depict only an outer shape thereof in order to simplify the drawing. Further, in FIGS. 2 and 3, COF 50, which is clearly depicted in FIG. 4, is depicted by alternate long and two short dashes lines.

<Nozzle Plate>

The nozzle plate 20 is formed of, for example, a metal material such as stainless steel or the like, silicon, or a synthetic resin material such as polyimide or the like. The plurality of nozzles 24 are formed for the nozzle plate 20. As depicted in FIG. 2, the plurality of nozzles 24, which discharge one color ink, are arranged in the conveyance direction to construct two arrays of nozzle arrays 25a, 25b which are aligned in the left-right direction. As for the two arrays of the nozzle arrays 25a, 25b, the positions of the nozzles 24 in the conveyance direction are deviated by a half (P/2) of the arrangement pitch of each of the nozzle arrays 25.

<Flow Passage Forming Member>

The flow passage forming member 21 is formed of silicon. The nozzle plate 20 described above is joined to the lower surface of the flow passage forming member 21. A plurality of pressure chambers 26, which are communicated with the plurality of nozzles 24 respectively, are formed for the flow passage forming member 21. Each of the pressure chambers 26 has a rectangular planner shape which is long in the scanning direction. The plurality of pressure chambers 26 are arranged in the conveyance direction corresponding to the arrangement of the plurality of nozzles 24 described above to construct two arrays of pressure chamber arrays.

<Piezoelectric Actuator>

The piezoelectric actuator 22 applies the discharge energy to the ink contained in the plurality of pressure chambers 26 in order to discharge the ink from the nozzles 24 respectively. The piezoelectric actuator 22 is arranged on the upper surface of the flow passage forming member 21. As depicted in FIGS. 2 to 4, the piezoelectric actuator 22 has such a structure that a plurality of films, which include, for example, a vibration film 30, a plurality of lower electrodes 31, a piezoelectric body 32, and an upper electrode 33, are stacked. Note that the plurality of films, which constitute the piezoelectric actuator 22, are formed by performing the film formation and the etching in accordance with any known semiconductor process technique on the upper surface of the silicon substrate to be formed into the flow passage forming member 21 as described later on as well.

The vibration film 30 is arranged in the entire region of the upper surface of the flow passage forming member 21 so that the plurality of pressure chambers 26 are covered therewith. The vibration film 30 is formed of, for example, silicon dioxide ($SiO_2$) or silicon nitride ($SiNx$). A plurality of communication holes 30a are formed at positions of the vibration film 30 overlapped with end portions of the plurality of pressure chambers 26 respectively. The plurality of pressure chambers 26 are communicated with the flow passage in the reservoir forming member 23 described later on respectively by the aid of the plurality of communication holes 30a.

The plurality of lower electrodes 31 are arranged in areas of the upper surface of the vibration film 30 overlapped with the pressure chambers 26 respectively. That is, the lower electrodes 31 are individual electrodes which are provided individually with respect to the pressure chambers 26. The shape of the lower electrode 31 is not specifically limited. However, FIG. 3 depicts the lower electrodes 31 having rectangular planar shapes smaller than the pressure chambers 26. As viewed from an upper position, a connecting portion 31a, which is provided at one end portion of the lower electrode 31 in the longitudinal direction, protrudes on the side opposite to the communication hole 30a with respect to the corresponding pressure chamber 26, and connecting portion 31a is connected to a wiring 35 as described later on. In particular, the lower electrode 31 has a main electrode portion 31b which is arranged in the area opposed to the pressure chamber 26, the connecting portion 31a which is connected to the wiring 35, and a linking portion 31 which links the main electrode portion 31b and the connecting portion 31a. The linking portion 31c is disposed outside the edge of the pressure chamber 26. Further, the part of the linking portion 31c (a small width portion 31d), which is disposed on the side of the main electrode portion 31b, has the width in the direction orthogonal to the scanning direction (extending direction of the linking portion 31c) which is smaller than those of the main electrode portion 31b and the connecting portion 31a. The material of the lower electrode 31 is not specifically limited. However, the lower electrode 31 can be formed of, for example, platinum (Pt). Further, the lower electrode 31 is not limited to the one layer structure. It is also allowable to adopt a structure in which a plurality of layers composed of different metals respectively is stacked.

As depicted in FIG. 2, the two piezoelectric bodies 32 are provided on the upper surface of the vibration film 30 corresponding to the two arrays of the pressure chamber arrays respectively. The shapes of the respective piezoelectric bodies 32 are not specifically limited as well. However, FIG. 2 depicts those having rectangular planar shapes which are long in the conveyance direction. Further, as depicted in FIG. 4, the side surface of each of the piezoelectric bodies 32 is inclined inwardly with respect to the plane orthogonal to the vibration film 30. The piezoelectric body 32 has a tapered cross-sectional shape in which the upper surface is smaller than the lower surface. The piezoelectric body 32 is composed of, for example, a piezoelectric material containing a main component of lead titanate zirconate (PZT) which is a mixed crystal of lead titanate and lead zirconate. Alternatively, the piezoelectric body 32 may be formed of a non-lead-based piezoelectric material in which no lead is contained.

Each of the piezoelectric bodies 32 is stacked on the plurality of lower electrodes 31 to extend over the plurality of lower electrodes 31 corresponding to one array of the pressure chamber array in the conveyance direction. In particular, the piezoelectric body 32 covers the main electrode portion 31b and the linking portion 31c of the lower electrode 31. Further, the piezoelectric body 32 is not overlapped with the connecting portion 31a of the lower electrode 31. In other words, the lower electrode 31 extends in the scanning direction so that a part thereof (connecting portion 31a) slightly protrudes from the piezoelectric body 32. The connecting portion 31a of the lower electrode 31, which protrudes from the piezoelectric body 32, is connected to the wiring 35 as described later on.

Note that as depicted in FIG. 3, a cutout 32a is formed on the side surface (right side surface as viewed in FIG. 3) of the end portion 32b of the piezoelectric body 32 disposed on the side of the connecting portion 31a. The cutout 32a is formed in a groove-shaped form extending in the thickness direction of the piezoelectric body 32 on the side surface of the piezoelectric body 32. The reason, why the cutout 32a is formed for the piezoelectric body 32, will be described in detail later on in the explanation of the production steps.

The two upper electrodes 33 are formed on the upper surfaces of the two piezoelectric bodies 32 respectively. Each of the upper electrodes 33 is arranged in the conveyance direction to extent over the plurality of lower electrodes 31. That is, the upper electrode 33 is the common electrode which is commonly opposed to the plurality of lower electrodes 31 aligned in the conveyance direction. Further, as depicted in FIGS. 2 and 3, each of the upper electrodes 33 is arranged in the entire region in the longitudinal direction of the piezoelectric body 32 so that each of the upper electrodes 33 is opposed to the main electrode portions 31b of the plurality of lower electrodes 31 with the piezoelectric body 32 intervening therebetween on the upper surface of the piezoelectric body 32. Further, the upper electrode 33 is also opposed to small width portions 31d having small widths of the linking portions 31c of the lower electrodes 31 with the piezoelectric body 32 intervening therebetween. However, as depicted in FIGS. 3 and 4, the upper electrode 33 is not arranged at the end portion 32b of the piezoelectric body 32 (right end portion as viewed in FIG. 3) disposed on the side of the connecting portion 31a. Note that the material of the upper electrode 33 is not specifically limited. However, the upper electrode 33 can be formed of, for example, iridium (Ir).

As depicted in FIGS. 3 and 4, two auxiliary electrodes 34, which extend in a lengthy manner in the conveyance direction, are provided respectively at the both end portions in the widthwise direction of one upper electrode 33 which extends in the conveyance direction. The auxiliary electrode 34 is formed of, for example, gold (Au). Although the width of the auxiliary electrode 34 is smaller than that of the upper electrode 33, the thickness is considerably large. If the upper electrode 33, which is arranged on the upper surface of the piezoelectric body 32, is thick, the deformation of the piezoelectric body 32 is inhibited. Therefore, it is preferable that the thickness of the upper electrode 33 is thin. However, if the thickness of the upper electrode 33 as the common electrode is thin, then the electrical resistance of the common electrode is increased, and any problem occurs, for example, such that the electric potential of the common electrode is unstable. In relation thereto, when the two auxiliary electrodes 34 having the large thicknesses are provided at the both end portions in the widthwise direction of the upper electrode 33, it is thereby possible to decrease the electrical resistance of the entire common electrode, while decreasing the inhibition of the deformation of the piezoelectric body 32.

Note that the portions of the piezoelectric body 32, which are interposed between the plurality of lower electrodes 31 and the upper electrode 33, are polarized in the downward direction in the thickness direction, i.e., in the direction directed from the upper electrode 33 to the lower electrodes 31 respectively.

Figure 5:
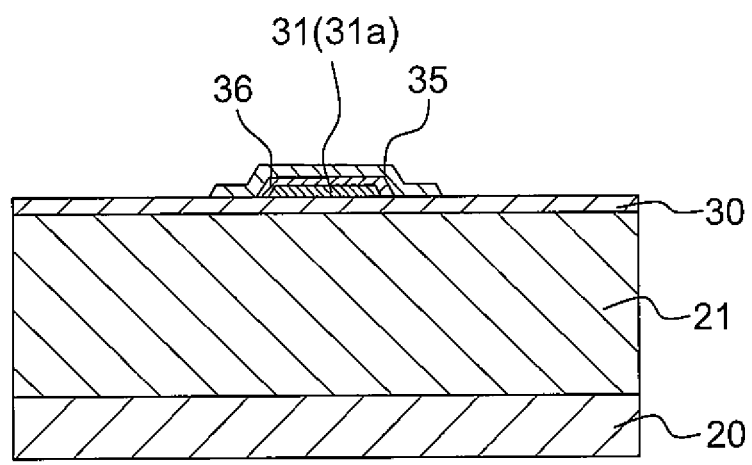
FIG. 5 is a sectional view taken along a line V-V in FIG. 3.

As depicted in FIGS. 3 and 4, a first conductive portion 36, which has a shape different from that of the lower electrode 31, is provided between the lower electrode 31 and the end portion 32b of the piezoelectric body 32 which covers the lower electrode 31. In particular, the first conductive portion 36 is overlapped with the lower electrode 31 so that the first conductive portion 36 extends over the region ranging from the connecting portion 31a up to the neighboring portion 31e which is the portion of the linking portion 31c adjoined to the connecting portion 31a. In this case, the neighboring portion 31e of the linking portion 31c can be also defined as the area of the lower electrode 31 overlapped with the end portion 32b of the piezoelectric body 32. As depicted in FIG. 3, the first conductive portion 36 is arranged on the outer side as compared with the edge of the pressure chamber 26 in the scanning direction and on the outer side as compared with the small width portion 31d of the lower electrode 31 (on the side of the connecting portion 31a). Further, the first conductive portion 36 is arranged on the outer side in the scanning direction as compared with the end portion (right end portion as viewed in FIG. 3) of the upper electrode 33 in the scanning direction. Note that in this embodiment, as depicted in FIGS. 3 to 5, the first conductive portion 36 covers the entire upper surface of the connecting portion 31a of the lower electrode 31. In other words, as viewed from an upper position, the first conductive portion 36 is larger than the connecting portion 31a of the lower electrode 31.

As depicted in FIGS. 2 to 4, the plurality of wirings 35, which are connected to the plurality of lower electrodes 31 respectively, are formed on the upper surface of the vibration film 30. Each of the wirings 35 is formed in the region ranging from the upper surface of the end portion the piezoelectric body 32 disposed on the side of the connecting portion 31a to the side surface of the piezoelectric body 32 and the surface of the first conductive portion 36. That is, the wiring 35 makes conduction with the connecting portion 31a of the lower electrode 31 by the aid of the first conductive portion 36. Note that in this embodiment, as depicted in FIG. 4, the end portion of the wiring 35 is formed to overhang up to the upper surface of the piezoelectric body 32. Accordingly, the contact area between the wiring 35 and the piezoelectric body 32 is increased, and the application of any locally high electric field to the piezoelectric body 32 is mitigated. Therefore, the piezoelectric body 32 is suppressed from the occurrence of any crack.

Further, each of the wirings 35 extends in the scanning direction from the connecting portion 31a of the lower electrode 31. In particular, as depicted in FIG. 2, the wirings 35, which are connected to the lower electrodes 31 arranged on the left side, extend to the left from the corresponding lower electrodes 31. The wirings 35, which are connected to the lower electrodes 31 arranged on the right side, extend to the right from the corresponding lower electrodes 31. Note that each of the wirings 35 is formed of, for example, gold (Au) or aluminum (Al).

In the meantime, the reason, why the first conductive portion 36 is provided for the connecting portion 31a of the lower electrode 31 connected to the wiring 35, is as follows. As described later on, in the steps of manufacturing the piezoelectric actuator 22, a piezoelectric material film 62 is formed as a film on the lower electrode 31, and the piezoelectric material film 62 is subjected to the patterning by means of the etching to form the piezoelectric body 32 (see FIG. 7). In this procedure, when the piezoelectric material film 62 is etched, it is feared that the connecting portion 31a of the lower electrode 31 and the neighboring portion thereof may be removed together. In relation thereto, in this embodiment, the first conductive portion 36 is superimposed on the lower electrode 31, and the connecting portion 31a of the lower electrode 31 is covered with the first conductive portion 36. Therefore, the first conductive portion 36 prevents such a situation that the connecting portion 31a is scraped off and the electrode thickness is thinned. The reliability of the electric connection is maintained between the connecting portion 31a and the wiring 35.

The conductive material, which forms the first conductive portion 36, is not limited to any specified material. It is possible to adopt various materials. However, it is preferable that the material of the first conductive portion 36 is selected in accordance with any one of the following viewpoints (1) to (3).

(1) As also explained later on as well, when the piezoelectric material film 62 is subjected to the patterning especially by means of the dry etching, it is feared that the first conductive portion 36 may be scraped off and removed together on account of the physical etching action of the dry etching. Accordingly, it is preferable that the first conductive portion 36 is formed of a metal which is harder than the lower electrode 31 so that the first conductive portion 36 is hardly scraped off when the piezoelectric material film 62 is subjected to the dry etching. For example, it is preferable that the first conductive portion 36 is formed of a hard metal including, for example, tantalum (Ta), tungsten (W), and iridium (Ir). Table 1 shows the Mohs hardness, the Vickers hardness, and the Brinell hardness in relation to W, Ta, and Ir respectively as the materials for forming the first conductive portion 36.

TABLE 1

| Metal material | Mohs hardness | Vickers hardness | Brinell hardness |
|---|---|---|---|
| Pt | 4 to 4.5 | 549 MPa | 392 MPa |
| W | 7.5 | 3430 MPa | 2570 MPa |
| Ta | 6.5 | 873 MPa | 800 MPa |
| Ir | 6.5 | 1760 MPa | 1670 MPa |

(2) When the first conductive portion 36 and the wiring 35 are formed of mutually different materials, the electrical resistance greatly differs at the boundary between the both. In this viewpoint, it is preferable that the first conductive portion 36 is formed of the same conductive material (for example, gold or aluminum) as that of the wiring 35.

(3) A part of the metal material contained in the first conductive portion 36 may be diffused into the piezoelectric body 32 in some cases. In accordance therewith, if the composition of the piezoelectric body 32 is changed, the piezoelectric characteristic is changed as well. In view of the above, it is preferable that the first conductive portion 36 is formed of a metal material which hardly affects the characteristic of the piezoelectric body 32.

In this viewpoint, it is preferable that the metal element, which constitutes the piezoelectric body 32, is not contained in the first conductive portion 36. For example, when the piezoelectric body 32 is composed of a piezoelectric material containing a main component of lead titanate zirconate (PZT), it is preferable that at least titanium (Ti), zirconia (Zr), and lead (Pb) are not contained in the first conductive portion 36.

As depicted in FIG. 2, each of the left and right both end portions of the flow passage forming member 21 (vibration film 30) is an electric joining portion 39 to which COF (Chip On Film) 50 as a wiring member is joined. Specifically, the plurality of wirings 35, which are led out leftwardly from the array of the lower electrodes 31 disposed on the left side, extend up to the electric joining portion 39 disposed on the left side. Further, the plurality of wirings 35, which are led out rightwardly from the array of the lower electrodes 31 disposed on the right side, extend up to the electric joining portion 39 disposed on the right side. Then, a plurality of driving contact portions 40, which are provided at the end portions of the plurality of wirings 35, are arranged at the electric joining portion 39 while being aligned in the conveyance direction. Further, two ground contact portions 41 are also arranged at each of the electric joining portions 39. Wirings 38, which are led out from the upper electrode 33, are connected to the respective ground contact portions 41.

As depicted in FIGS. 2 to 4, two COF's 50 are joined respectively to the two electric joining portions 39 of the piezoelectric actuator 22 described above. Then, a plurality of wirings 55, which are formed on each COF 50, are electrically connected to the plurality of driving contact portions 40 respectively. Although not depicted in the drawing, each COF 50 is also connected to the controller 6 of the printer 1 (see FIG. 1).

Driver IC 51 is mounted on each COF 50. The driver IC generates and outputs the driving signal for driving the piezoelectric actuator 22 on the basis of the control signal sent from the controller 6. The driving signal, which is outputted from the driver IC 51, is inputted into the driving contact portion 40 via the wiring 55 of COF 50. Further, the driving signal is supplied to each of the lower electrodes 31 via the wiring 35 of the piezoelectric actuator 22. The lower electrode 31, to which the driving signal is supplied, has the electric potential which changes between a predetermined driving electric potential and the ground electric potential. Further, a ground wiring (not depicted) is also formed for COF 50. The ground wiring is electrically connected to the ground contact portion 41 of the piezoelectric actuator 22. Accordingly, the upper electrode 33, which is connected to the ground contact portion 41, has the electric potential which is always maintained at the ground electric potential.

An explanation will be made about the operation of the piezoelectric actuator 22 when the driving signal is supplied from the driver IC 51. In the state in which the driving signal is not supplied, the electric potential of the lower electrode 31 is the ground electric potential, which is the same as the electric potential of the upper electrode 33. Starting from this state, when the driving signal is supplied to a certain lower electrode 31, and the driving electric potential is applied to the lower electrode 31, then the electric field, which is parallel to the thickness direction, acts on the piezoelectric body 32 in accordance with the electric potential difference between the lower electrode 31 and the upper electrode 33. In this situation, the direction of polarization of the piezoelectric body 32 is coincident with the direction of the electric field. Therefore, the piezoelectric body 32 is elongated in the thickness direction which is the direction of polarization thereof, and the piezoelectric body 32 is shrunk in the in-plane direction (surface direction). The vibration film 30 is warped or flexibly bent so that the vibration film 30 protrudes toward the pressure chamber 26 in accordance with the shrinkage deformation of the piezoelectric body 32. Accordingly, the volume of the pressure chamber 26 is decreased, and the pressure wave is generated in the pressure chamber 26. Thus, the droplets of the ink are discharged from the nozzle 24 communicated with the pressure chamber 26.

<Reservoir Forming Member>

As depicted in FIGS. 4 and 5, the reservoir forming member 23 is arranged on the side (upside) opposite to the flow passage forming member 21 with the piezoelectric actuator 22 intervening therebetween, and the reservoir forming member 23 is joined to the upper surface of the piezoelectric actuator 22 by using an adhesive. The reservoir forming member 23 may be formed of, for example, silicon in the same manner as the flow passage forming member 21. However, the reservoir forming member 23 may be formed of any material other than silicon, for example, a metal material or a synthetic resin material.

As depicted in FIG. 4, a reservoir 52, which extends in the conveyance direction, is formed at an upper half portion of the reservoir forming member 23. Each of the reservoirs 52 is connected via an unillustrated tube to the cartridge holder 7 (see FIG. 1) to which the ink cartridges 17 are installed.

A plurality of ink supply flow passages 53, which extends downwardly from the reservoir 52, is formed at a lower half portion of the reservoir forming member 23. The respective ink supply flow passages 53 are communicated with the plurality of communication holes 30*a* which are formed through the vibration film 30 of the piezoelectric actuator 22. Accordingly, the ink is supplied from the reservoir 52 via the plurality of ink supply flow passages 53 and the plurality of communication holes 30*a* to the plurality of pressure chambers 26 of the flow passage forming member 21. Further, a recessed protective cover portion 54, which covers the plurality of piezoelectric bodies 32 of the piezoelectric actuator 22, is also formed at the lower half portion of the reservoir forming member 23.

Next, an explanation will be made with reference to FIGS. 6 to 8 about the manufacturing steps of the head unit 16 of the ink-jet head 4 described above, especially principally about the manufacturing steps of the piezoelectric actuator 22. FIGS. 6 to 8 illustrate the manufacturing steps of the ink-jet head respectively.

Figure 6A:
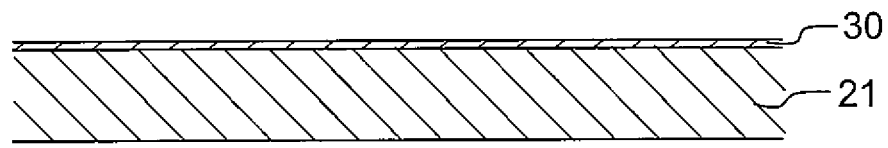
FIG. 6A depicts a vibration film forming step.
Figure 6B:
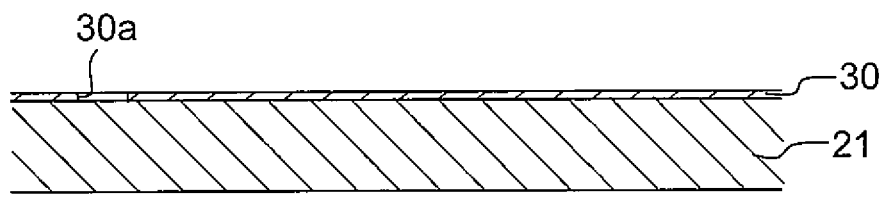
FIG. 6B depicts a vibration film etching step.

In this embodiment, the piezoelectric actuator 22 is produced by stacking various films in accordance with the semiconductor process including, for example, the film formation and the patterning on the flow passage forming member 21 as the silicon substrate. At first, as depicted in FIG. 6A, the vibration film 30 of silicon dioxide or the like is formed as a film on the surface of the flow passage forming member 21 as the silicon substrate. Further, as depicted in FIG. 6B, the communication holes 30*a* are formed through the vibration film 30 by means of the etching.

Figure 6C:
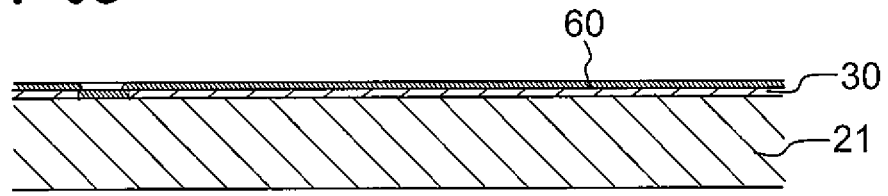
FIG. 6C depicts a film forming step for a conductive film to serve as a lower electrode.
Figure 6D:
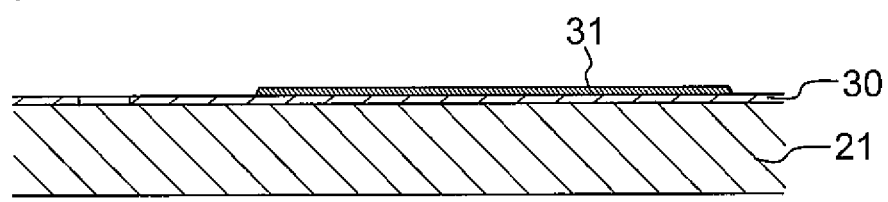
FIG. 6D depicts a lower electrode forming (conductive film patterning) step.

Subsequently, the plurality of lower electrodes 31 are formed on the vibration film 30. At first, as depicted in FIG. 6C, a conductive film 60 for the lower electrodes 31 is formed, for example, by means of the sputtering on the vibration film 30. Then, as depicted in FIG. 6D, the conductive film 60 is subjected to the patterning by means of the etching, and thus the plurality of lower electrodes 31 are formed.

Figure 6E:
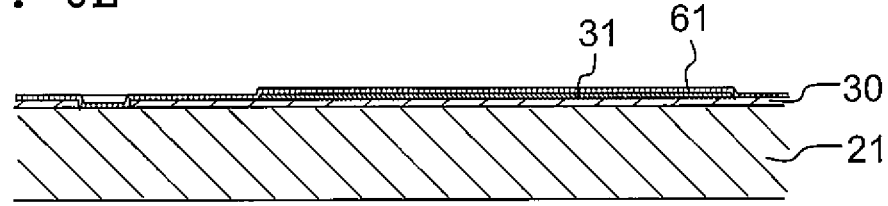
FIG. 6E depicts a conductive film forming step for a first conductive portion.
Figure 6F:
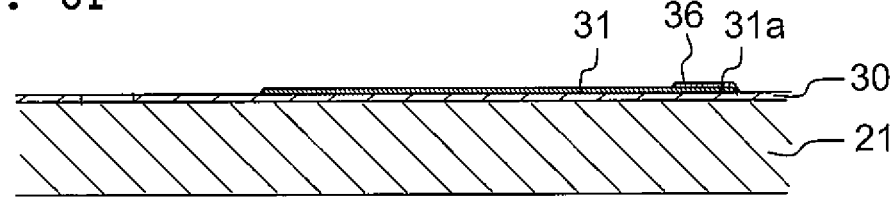
FIG. 6F depicts a first conductive portion forming (conductive film patterning) step.

Subsequently, the first conductive portions 36 are formed for the plurality of lower electrodes 31 respectively. As depicted in FIG. 6E, a conductive film 61 for the first conductive portions 36 is formed on the vibration film 30, for example, by means of the sputtering so that the plurality of lower electrodes 31 are covered therewith. Then, as depicted in FIG. 6F, the conductive film 61 is subjected to the patterning by means of the etching, and thus the first conductive portions 36 are formed so that the connecting portions 31*a* of the lower electrodes 31 and the neighboring portions thereof are covered therewith.

Figure 7A:
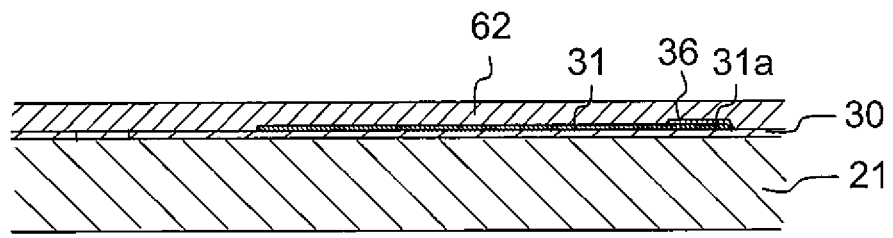
FIG. 7A depicts a piezoelectric material film forming step.
Figure 7B:
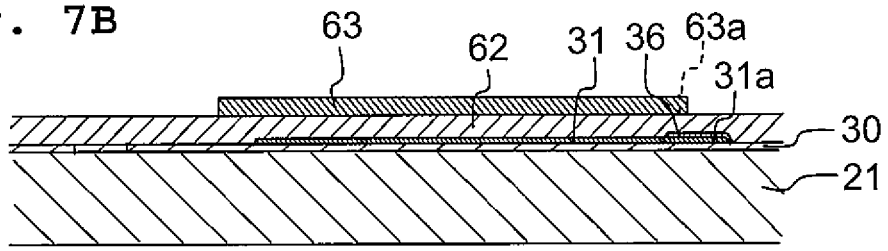
FIG. 7B depicts a mask forming step.
Figure 7C:
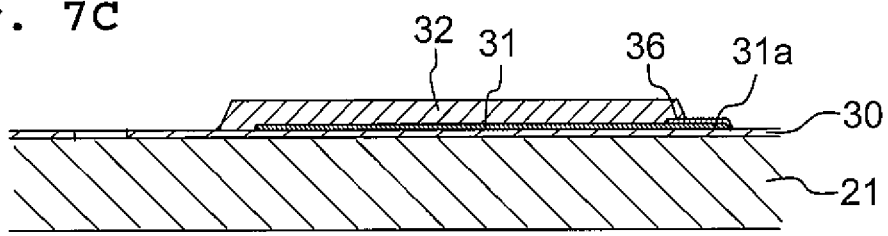
FIG. 7C depicts a piezoelectric body forming (piezoelectric film patterning) step.

Subsequently, the piezoelectric body 32 is formed on the plurality of lower electrodes 31. At first, as depicted in FIG. 7A, a piezoelectric material film 62 is formed as a film by means of the sol-gel method or the sputtering in the entire region of the upper surface of the vibration film 30 so that the lower electrodes 31 and the first conductive portions 36 are covered therewith. Subsequently, as depicted in FIG. 7B, a mask 63 of resist pattern, which corresponds to the shape of the piezoelectric body 32, is formed on the piezoelectric material film 62. After that, unnecessary portions of the piezoelectric material film 62 are removed by means of the dry etching to perform the patterning so that the piezoelectric body 32 is formed. Note that when the unnecessary portions of the piezoelectric material film 62 are removed by means of the dry etching, the side surfaces of the piezoelectric body 32 are formed to provide such shapes that the side surfaces are inclined inwardly with respect to the plane orthogonal to the vibration film 30.

An explanation will be supplemented about the dry etching for the piezoelectric material film 62. When the flow passage forming member 21, which is formed with the piezoelectric material film 62 as the film, is installed in a chamber of an etching apparatus, and the plasma is generated after enclosing the carrier gas in the chamber, then the ion is accelerated in the chamber, and the ion collides with the piezoelectric material film 62. For example, a mixed gas, which contains halogen-based gas (for example, $CHF_3$, $SF_6$, $BCl_3$, $Cl_2$) and any one of oxygen, nitrogen, and argon (Ar), is used, and the dry etching is performed in the chamber in the plasma atmosphere at a chamber pressure of 0.5 to 50 Pa.

In the case of the general dry etching, the etching advances in accordance with the actions of both of the physical etching based on the collision of the ion and the chemical etching based on the chemical reaction between the ion and the processing objective. However, in the case of the etching for the piezoelectric material such as PZT or the like, the chemical etching hardly advances, for example, for such a reason that the reaction product, which is produced by the chemical reaction, has the low volatility, and the physical etching principally occurs. In other words, the etching for the piezoelectric material film 62 advances in such a form that the piezoelectric material is scraped off by the energy generated when the ion collides.

Therefore, when the portions of the piezoelectric material film 62, which cover the connecting portions 31a, are removed by means of the dry etching for the piezoelectric material film 62, it is feared that the connecting portions 31a of the lower electrodes 31, which are disposed thereunder or therebelow, may be scraped off and removed together in accordance with the physical etching action. In this procedure, if the connecting portions 31a of the lower electrodes 31, which protrude from the piezoelectric body 32, are scraped off, and the electrode thickness is thinned at the portions, then the reliability of the electrical connection is lowered between the connecting portions 31a and the wirings 35. However, in this embodiment, the first conductive portion 36 is superimposed to cover the connecting portion 31a protruding from the piezoelectric body 32 and the neighboring portion of the connecting portion 31a covered with the piezoelectric body 32, and the connecting portion 31a and the neighboring portion thereof are protected by the first conductive portion 36. Therefore, such a situation is suppressed that the lower electrode 31 is scraped off by the dry etching for the piezoelectric material 62 and the electrode thickness is thinned. The reliability of the electrical connection is maintained between the lower electrode 31 and the wiring 35. Further, when the first conductive portion 36 is formed of the material harder than the lower electrode 31, then the first conductive portion 36 is hardly scraped off during the dry etching for the piezoelectric material film 62, and the reliability of the electrical connection with respect to the wiring 35 is enhanced.

Note that with reference to FIG. 7B, the mask 63, which is used for the dry etching, is formed with cutouts 63a which are disposed at portions overlapped with the first conductive portions 36 when the mask is installed on the upper surface of the piezoelectric material film 62. The cutout 63a is open laterally (on the right side in the drawing), and the cutout 63a has a groove shape extending in the thickness direction of the mask 63. The cutouts 63a are formed for the mask 63, and hence the cutouts 32a (see FIG. 3) are also formed on the side surface of the end portion 32b of the piezoelectric body 32 by means of the dry etching. However, the provision of the cutouts 63a for the mask 63 is not principally aimed to form the cutouts 32a for the piezoelectric body 32. When the cutouts 63a are formed for the mask 63, then the piezoelectric material film 62 is hardly etched and the etching speed is lowered at the inside of the cutouts 63a as compared with the other areas which are not covered with the mask 63. In other words, when the etching is performed for the piezoelectric material film 62, the speed of advance of the etching is slow at the inside of the cutout 63a of the mask 63. Therefore, the connecting portion 31a and the first conductive portion 36 are hardly removed, and they remain with ease. Therefore, the reliability of the electrical connection is improved between the wiring 35 and the connecting portion 31a of the lower electrode 31 as compared with a case in which the mask 63 has no cutout 63a.

Figure 7D:
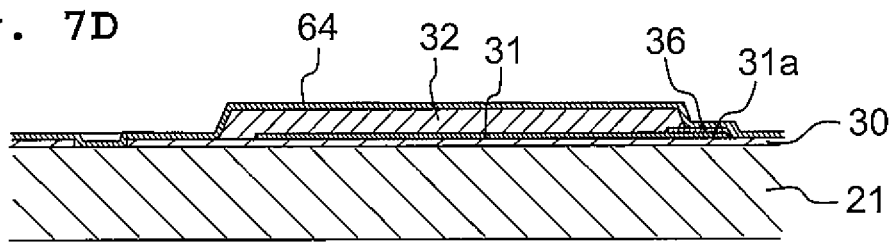
FIG. 7D depicts a conductive film forming step for an upper electrode.
Figure 7E:
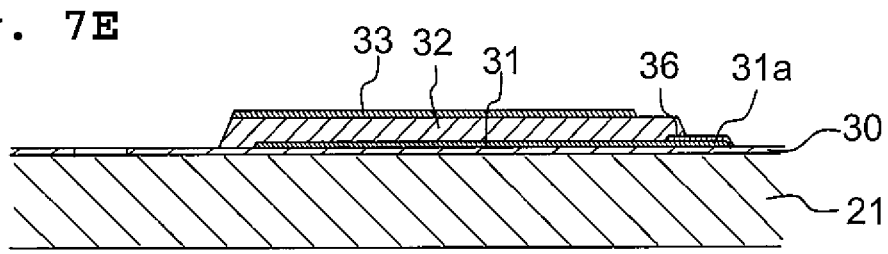
FIG. 7E depicts an upper electrode forming (conductive film patterning) step.
Figure 7F:
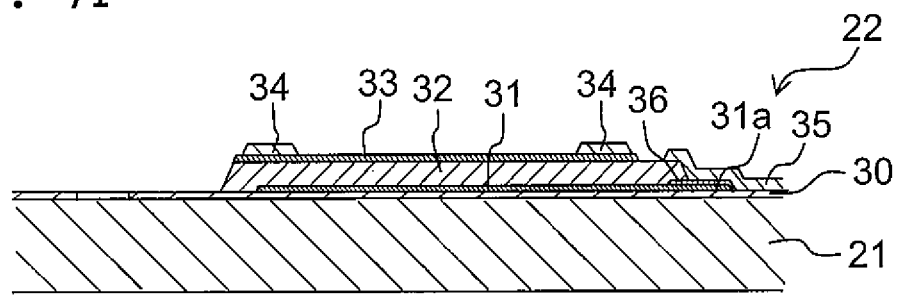
FIG. 7F depicts an auxiliary electrode forming step and a wiring forming step.

After the formation of the piezoelectric body 32, the upper electrodes 33 are formed on the upper surface of the piezoelectric body 32. As depicted in FIG. 7D, a conductive film 64 for the upper electrode 33 is formed as a film, for example, by means of the sputtering on the upper surface of the vibration film 30 and the upper surface of the piezoelectric body 32. After that, as depicted in FIG. 7E, the conductive film 64 is subjected to the patterning by means of the etching to form the upper electrode 33. After that, as depicted in FIG. 7F, the two auxiliary electrodes 34 are formed on the upper surface of the upper electrode 33. Further, the wirings 35, which extend from the upper surface to the side surface of the piezoelectric body 32 and to the first conductive portions 36, are formed. When the material (for example, gold (Au)) of the auxiliary electrodes 34 is the same as that of the wirings 35, the auxiliary electrodes 34 and the wirings 35 can be formed in the same step. That is, a conductive film of gold is formed as a film, and the conductive film is subjected to the patterning by means of the etching. Thus, the auxiliary electrodes 34 and the wirings 35 are formed in a separated manner. In accordance with the steps as described above, the production of the piezoelectric actuator 22 is completed.

Figure 8A:
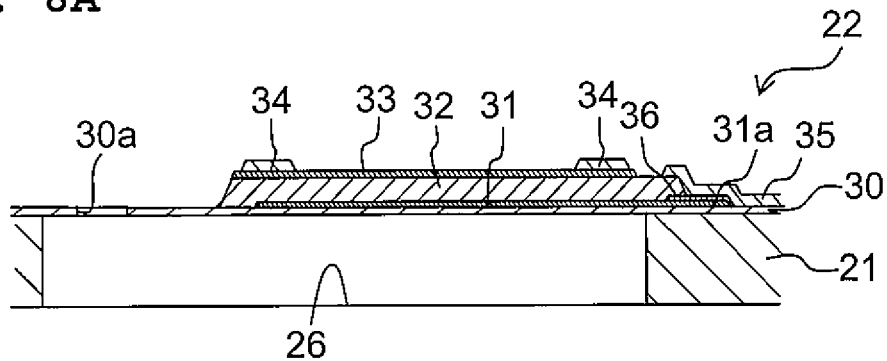
FIG. 8A depicts an etching step for a flow passage forming member.
Figure 8B:
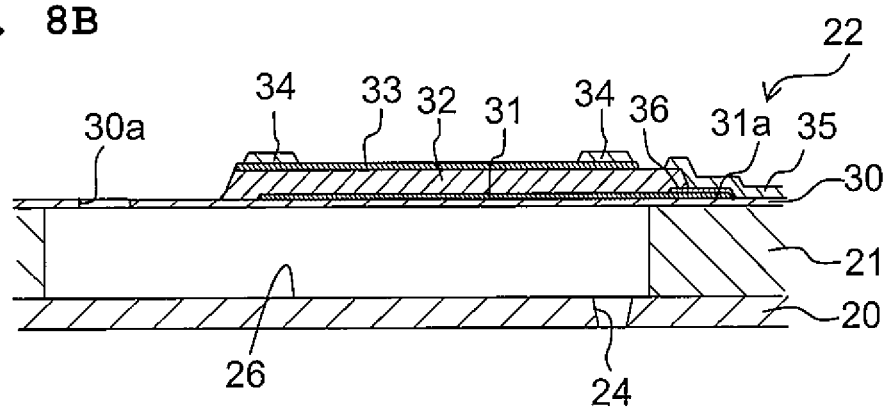
FIG. 8B depicts a joining step for a nozzle plate.
Figure 8C:
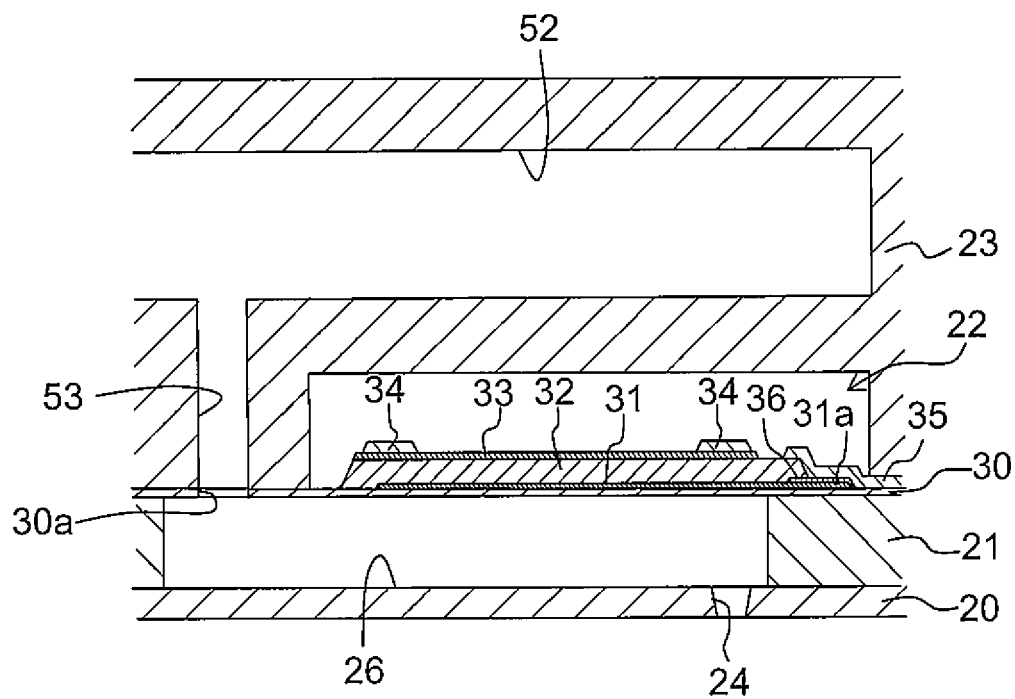
FIG. 8C depicts a joining step for a reservoir forming member.

As depicted in FIG. 8A, the pressure chambers 26 are formed by performing the etching from the lower surface side of the flow passage forming member 21 disposed on the side opposite to the piezoelectric actuator 22. Further, as depicted in FIG. 8B, the nozzle plate 20 is joined by using an adhesive to the lower surface of the flow passage forming member 21. Finally, as depicted in FIG. 8C, the reservoir forming member 23 is joined to the piezoelectric actuator 22 by using an adhesive.

In the embodiment explained above, the vibration film 30, which is provided for the flow passage forming member 21, corresponds to the "substrate" according to the present teaching. The lower electrode 31, which is positioned on the lower side of the piezoelectric body 32, corresponds to the "first electrode" according to the present teaching. The upper electrode 33, which is positioned on the upper side of the piezoelectric body 32, corresponds to the "second electrode" according to the present teaching.

Next, an explanation will be made about modified embodiments in which various modifications are applied to the embodiment described above. However, those constructed in the same manner as those of the embodiment described above are designated by the same reference numerals, and any explanation thereof will be appropriately omitted.

Figure 9A:
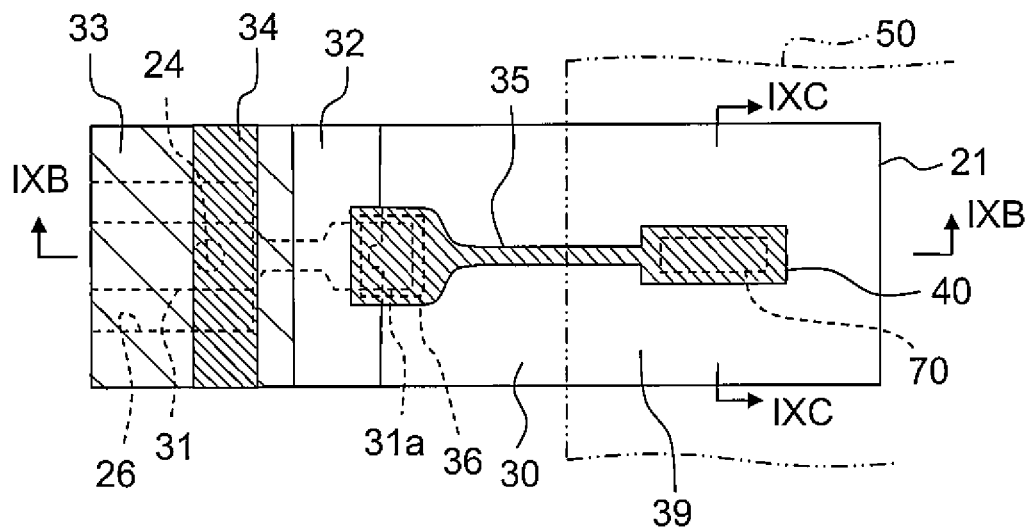
Figure 9B:
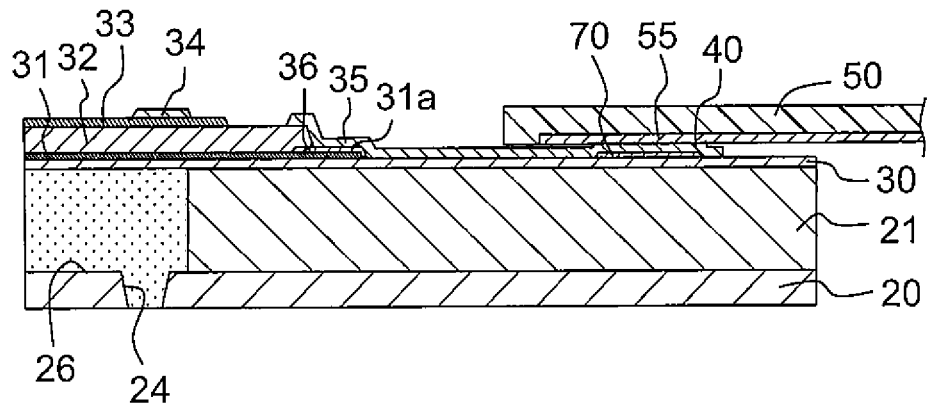
Figure 9C:
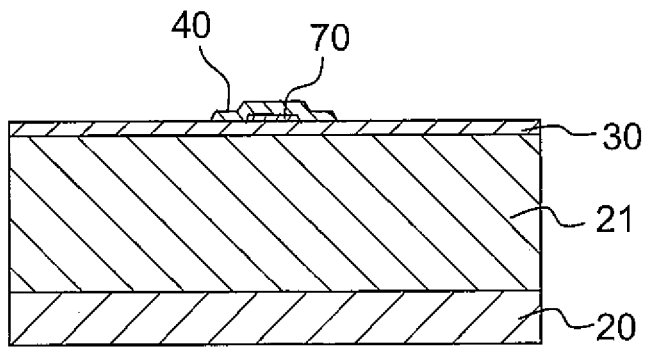

(1) As depicted in FIGS. 9A to 9C, a second conductive portion 70, which is formed of the same material as that of the first conductive portion 36, may be arranged for the electric joining portion 39 of the flow passage forming member 21 (vibration film 30). The second conductive portion 70 can be simultaneously formed in accordance with the same step as that for the first conductive portion 36. When the second conductive portion 70 is provided on the lower side of the wiring 35 (driving contact portion 40) in the electric joining portion 39, the driving contact portion 40, which covers the second conductive portion 70, rises thereby as compared with the surroundings. Accordingly, when COF 50 is joined to the driving contact portion 40 of the electric joining portion 39, then COF 50 can be strongly pressed against the driving contact portion 40 locally, and the reliability of the joining is enhanced. Further, as depicted in FIG. 9C, it is preferable that the cross-sectional shape of the second conductive portion 70 is such a tapered shape that the cross-sectional shape is more tapered at positions disposed farther on the upper side (side opposite to the vibration film 30). Accordingly, a part of the wiring 35 (driving contact portion 40) to cover the second conductive portion 70 locally protrudes, and hence COF 50 can be pressed thereagainst more strongly. The reliability of the joining is further improved.

Figure 10A:
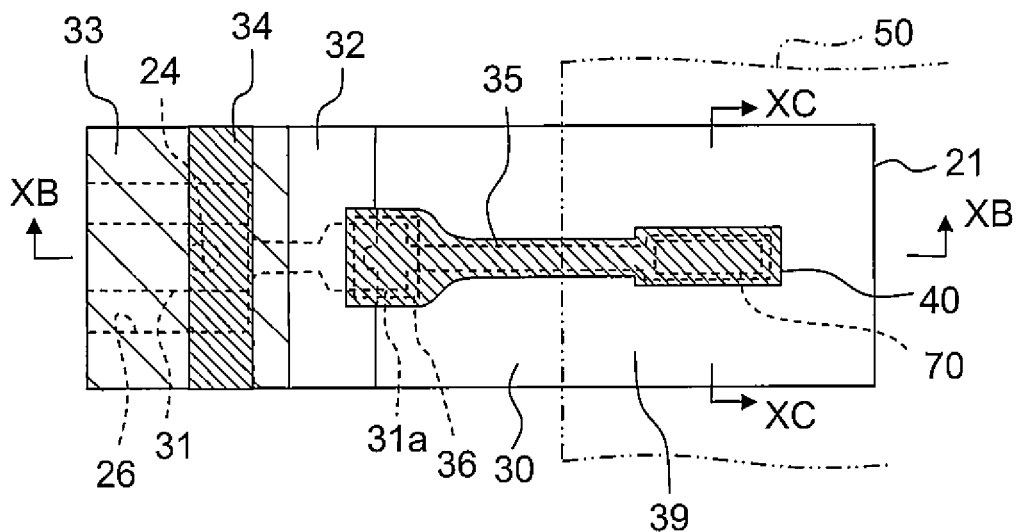
Figure 10B:
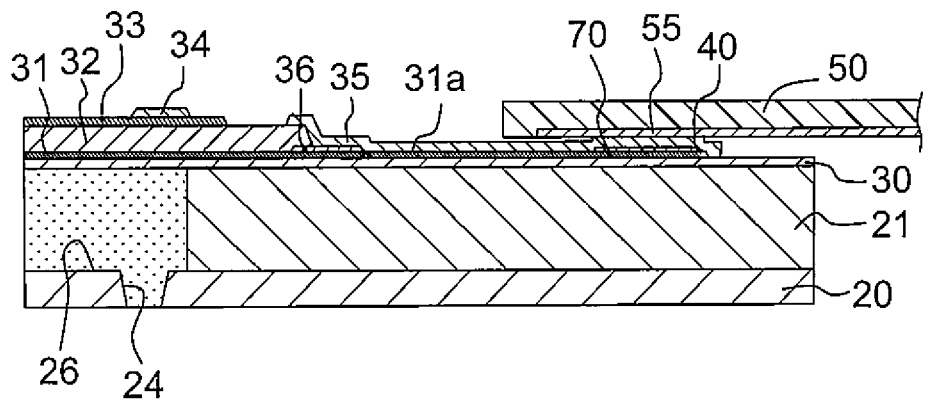
Figure 10C:
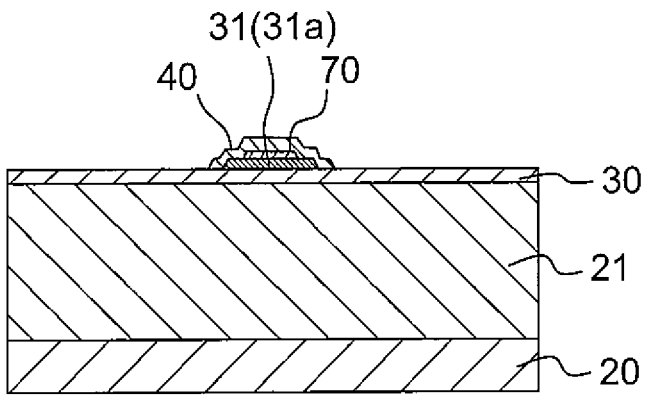
Figure 11A:
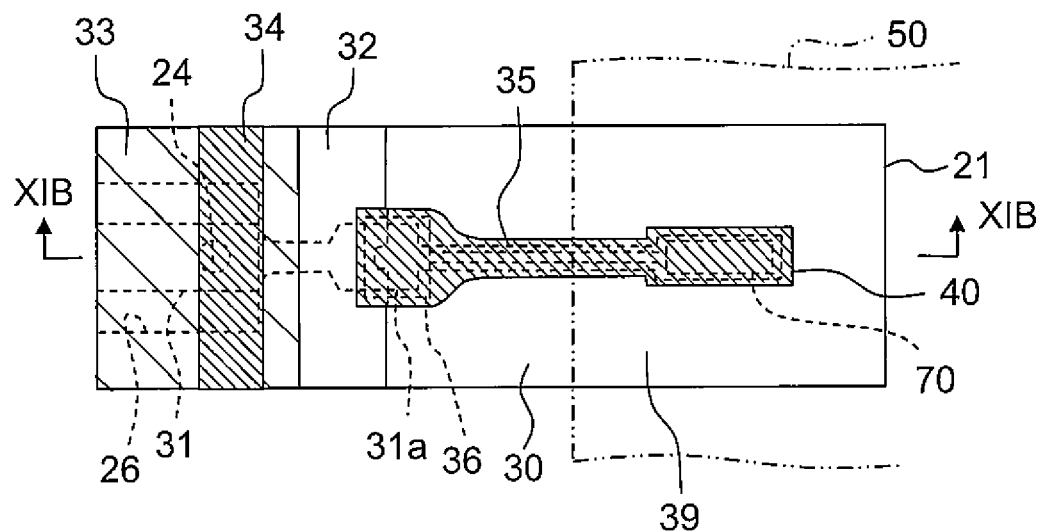
Figure 11B:
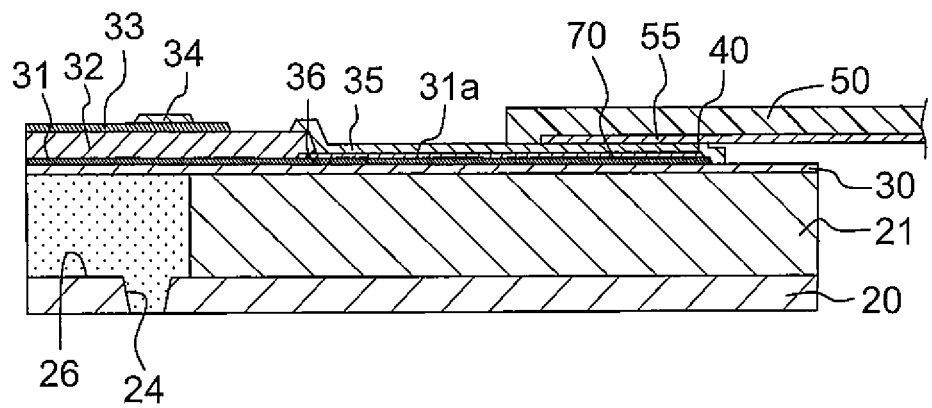

The following modifications can be further applied to the embodiment depicted in FIGS. 9A to 9C. At first, as depicted in FIGS. 10A to 10C, the connecting portion 31a of the lower electrode 31 may extend up to the electric joining portion 39. In this case, the connecting portion 31a of the lower electrode 31 is arranged under or below the wiring 35 extending to the electric joining portion 39. Therefore, the wiring 35 is substantially thickened, and the conduction reliability of the wring 35 is improved. Further, as depicted in FIGS. 11A and 11B, the first conductive portion 36 may also extend up to the electric joining portion 39 together with the connecting portion 31a of the lower electrode 31, and the first conductive portion 36 and the second conductive portion 70 may make conduction. In this case, the substantial thickness of the wiring 35 is further thickened, and hence the conduction reliability of the wring 35 is further improved.

Figure 12A:
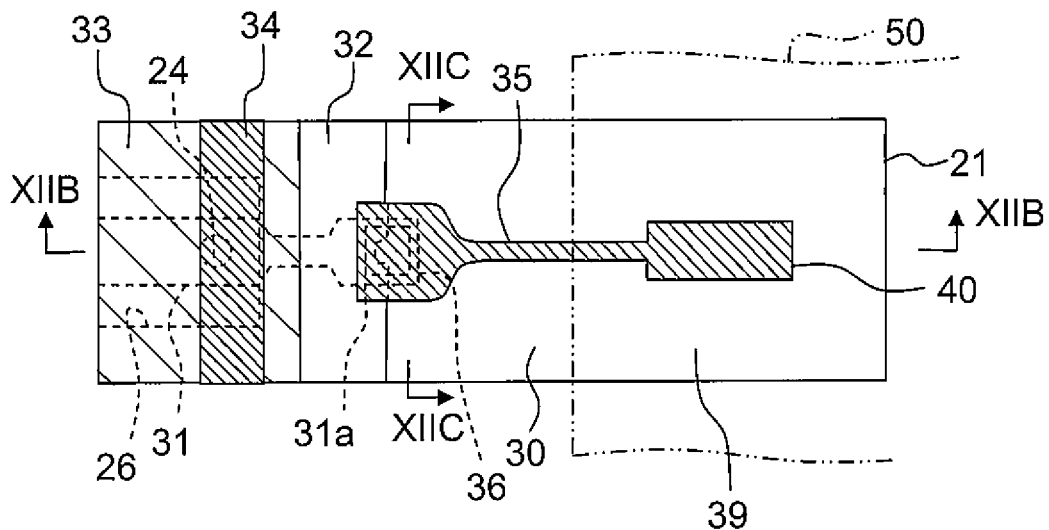
Figure 12B:
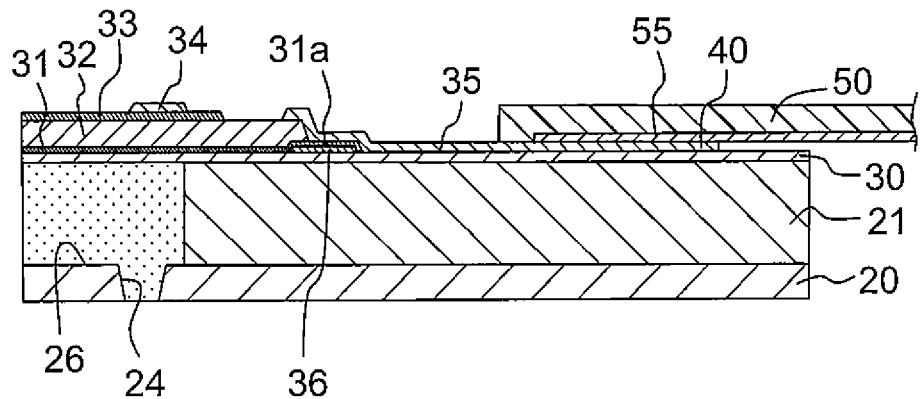
Figure 12C:
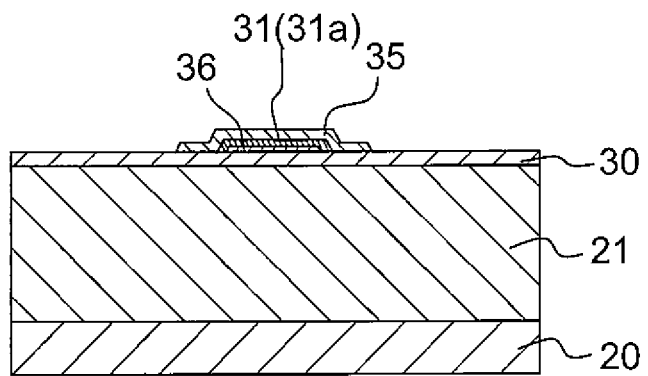

(2) In the embodiment described above, as depicted in FIGS. 4 and 5, the first conductive portion 36 is arranged so that the upper surface of the connecting portion 31a of the lower electrode 31 is covered therewith. In contrast thereto, as depicted in FIGS. 12A to 12C, it is also allowable to adopt a form in which the first conductive portion 36 and the lower electrode 31 are arranged upside down, i.e., a form in which the lower electrode 31 covers the upper surface of the first conductive portion 36. In this case, even when a part of the connecting portion 31a of the lower electrode 31 is removed when the piezoelectric material film 62 is etched, then the electrical connection between the connecting portion 31a and the wiring 35 is maintained by the first conductive portion 36 disposed under or below the connecting portion 31a.

(3) In the embodiment described above, the patterning for the piezoelectric material film 62 (see FIG. 7C) is performed by means of the dry etching. However, the patterning for the piezoelectric material film 62 can be also performed by means of the wet etching.

Figure 13A:
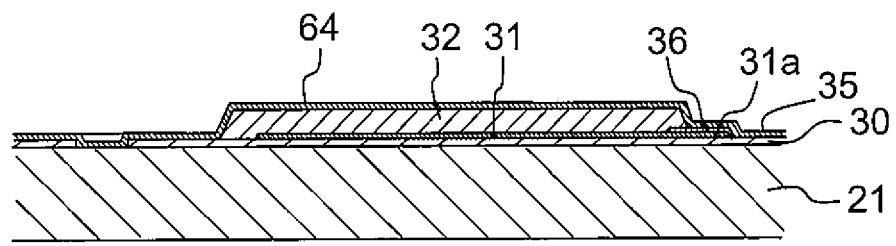
Figure 13B:
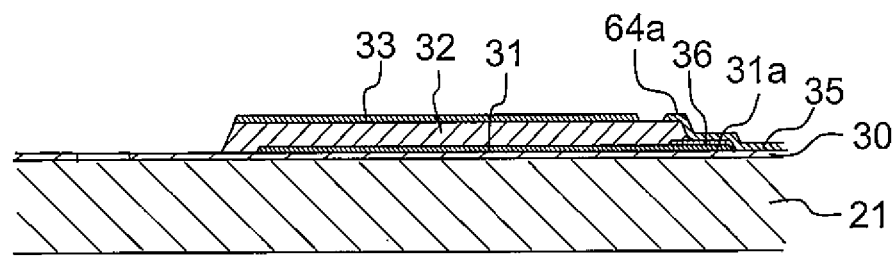

(4) In the foregoing embodiment, the piezoelectric material film 62 is subjected to the patterning to form the piezoelectric body 32, and then the upper electrode 33 is formed on the upper surface of the piezoelectric body 32. In the step of forming the upper electrode 33, as depicted in FIG. 13A, the conductive film 64 is formed as the film to cover the connecting portion 31a of the lower electrode 31 and the piezoelectric body 32, and then the conductive film 64 is subjected to the patterning as depicted in FIG. 13B. In the embodiment described above (FIG. 7E), the portion of the conductive film 64, which covers the connecting portion 31a, is removed during the patterning. However, it is also assumed that parts of the connecting portion 31a and the first conductive portion 36 may be removed during this process. Accordingly, as depicted in FIG. 13B, the portion 64a (third conductive portion) of the conductive film 64, which covers the connecting portion 31a, may be allowed to remain without being removed after being separated from the upper electrode 33 in the patterning step for the conductive film 64. In this case, the connecting portion 31a of the lower electrode 31 and the first conductive portion 36 are not removed by the etching during the formation of the upper electrode 33.

Figure 14:
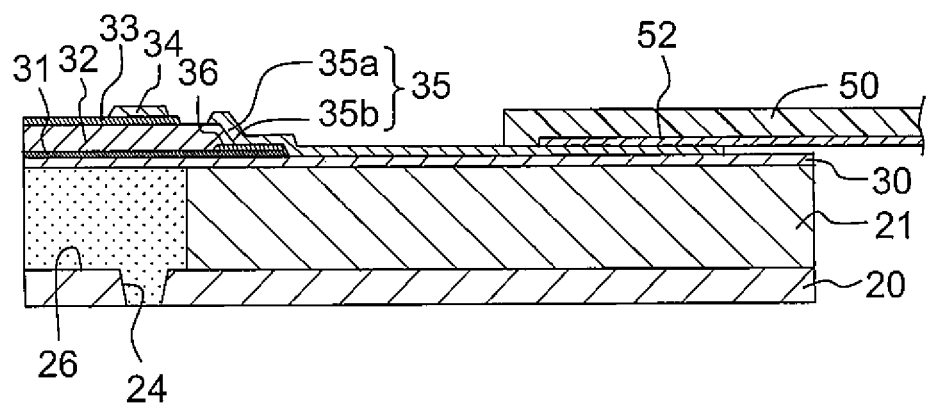
FIG. 14 is a sectional view illustrating a head unit according to still another modified embodiment.

(5) As depicted in FIG. 14, when the wiring 35 has a thin seed layer 35b and a main layer 35a disposed thereon, if the film thickness of the seed layer 35b is uneven, then it is feared that the thin seed layer 35b may be divided at any intermediate position. In particular, the side surface of the piezoelectric body 32 is such a place that the seed layer 35b hardly adheres, on which the film thickness of the seed layer 35b easily becomes uneven. In this viewpoint, it is desirable that the side surface of the piezoelectric body 32 is a gently inclined surface. Accordingly, it is also preferable that the angle of inclination of the side surface of the piezoelectric body 32 may be made gentler by using any method such as the reverse sputtering or the like after the side surface of the piezoelectric body 32 is formed into the inclined surface during the etching for the piezoelectric material film 62.

Figure 15:
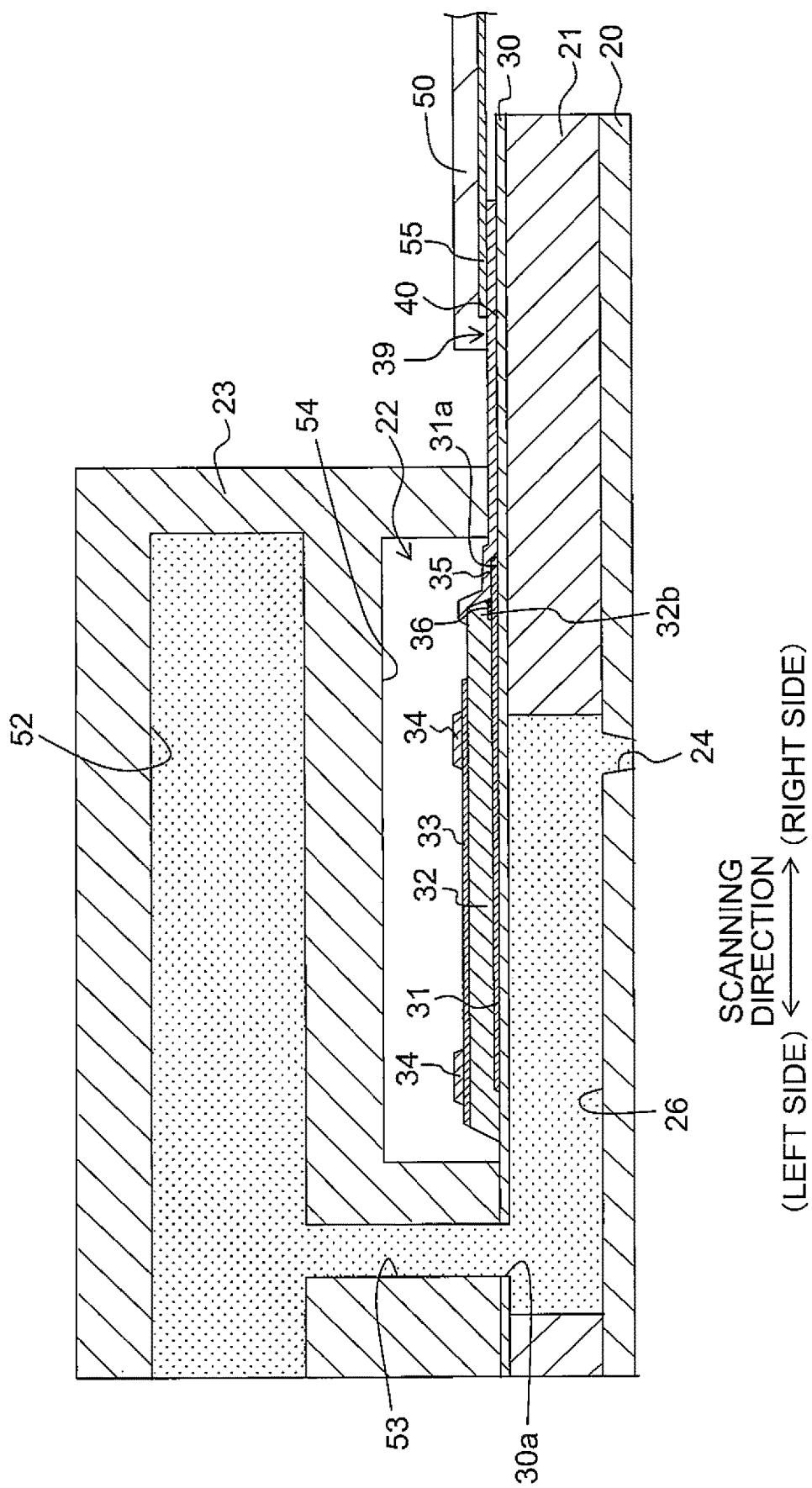
FIG. 15 is a sectional view illustrating a head unit according to still another modified embodiment corresponding to FIG. 4.

(6) In the embodiment described above, as depicted in FIG. 4, the first conductive portion 36 is provided to extend over from the area of the lower electrode 31 overlapped with the end portion 32b of the piezoelectric body 32 up to the connecting portion 31a on the lower side of the end portion 32b of the piezoelectric body 32. Therefore, even if the first conductive portion 36 is scraped off to some extent when the piezoelectric material film is etched, then the conduction is maintained between the lower electrode 31 and the wiring 35. Further, as depicted in FIG. 15, no problem occurs even when the first conductive portion 36, which covers the connecting portion 31a of the lower electrode 31, is completely removed by the etching for the piezoelectric material film. In other words, the first conductive portion 36 may be provided on the lower electrode 31 in the area overlapped with the end portion 32b of the piezoelectric body 32, only the lower electrode 31 may protrude from the end portion 32b of the piezoelectric body 32, and the protruding portion may serve as the connecting portion with respect to the wiring 35. Alternatively, as depicted in FIG. 16, in a form in which the first conductive portion 36 is arranged on the lower side of the lower electrode 31 in the area overlapped with the end portion 32b of the piezoelectric body 32, no problem occurs even when the portion of the lower electrode 31, which covers the first conductive portion 36, is completely removed in the area protruding from the end portion 32b of the piezoelectric body 32. In other words, only the first conductive portion 36 may protrude from the end portion 32b of the piezoelectric body 32, and the protruding portion may serve as the connecting portion with respect to the wiring 35.

(7) If the lower electrode 31 is thick, the deformation of the piezoelectric body 32 is inhibited by the lower electrode 31 when the voltage is applied to the piezoelectric body 32. Accordingly, it is also appropriate that a thin-walled portion, which has a small thickness as compared with the surroundings, is formed by the half etching at a central portion of the lower electrode 31 during the formation of the lower electrode 31 (during the patterning for the conductive film 60) depicted in FIGS. 6C and 6D.

(8) In the embodiment described above, the lower electrode 31, which is disposed on the lower side (side of the vibration film 30) with respect to the piezoelectric body 32, is the individual electrode, and the upper electrode 33, which is disposed on the upper side (side opposite to the vibration film 30), is the common electrode. In contrast thereto, the lower electrode 31 may be a common electrode, and the upper electrode 33 may be an individual electrode.

(9) The structure of the ink flow passage of the ink-jet head 4 is not limited to the structure described in the foregoing embodiment. For example, the structure can be modified as follows. In the embodiment described above, as depicted in FIG. 4, the flow passage is constructed such that the ink is supplied individually from the reservoir 52 in the reservoir forming member 23 via the plurality of communication holes 30a to the plurality of pressure chambers 26 respectively. In contrast thereto, it is also appropriate that any flow passage, which corresponds to the reservoir 52, is formed in the flow passage forming member 21. For example, it is also appropriate that a manifold flow passage, which extends in the arrangement direction of the plurality of pressure chambers 26, is formed in the flow passage forming member 31, and the ink is individually distributed and supplied from one manifold flow passage to the plurality of pressure chambers 26 in the flow passage forming member 21.

In the embodiment and the modified embodiments explained above, the present teaching is applied to the piezoelectric actuator for the ink-jet head for printing, for example, an image by discharging the inks onto the recording paper. However, the present teaching is also applicable to any liquid discharge apparatus to be used for various ways of use other than the printing of the image or the like. For example, the present teaching can be also applied to a liquid discharge apparatus for discharging a conductive liquid onto a substrate to form a conductive pattern on a surface of the substrate. Further, the piezoelectric actuator of the present teaching is not limited to those used in order to apply the pressure to the liquid as well. For example, the present teaching can be also applied, for example, to an actuator which moves a solid object and an actuator which pressurizes a gas.

What is claimed is:

1. A piezoelectric actuator comprising:
   a substrate, the substrate having a first end and a second end in a first direction which is along a planer direction of the substrate;
   a first conductive layer at least partially overlapping with the substrate in a second direction which is orthogonal to the planar direction of the substrate, the first conductive layer having a third end and a fourth end in the first direction;
   a second conductive layer at least partially overlapping with the first conductive layer and the substrate in the second direction, the second conductive layer having a fifth end and a sixth end in the first direction;
   a piezoelectric body at least partially overlapping with the substrate, the first conductive layer, and the second conductive layer in the second direction, the piezoelectric body having a seventh end and an eighth end in the first direction, wherein the first conductive layer is at least partially positioned between the piezoelectric body and the substrate in the second direction; and
   a wiring connected to the first conductive layer;
   wherein the third end of the first conductive layer is positioned between the first end of the substrate and the fourth end of the first conductive layer in the first direction;
   wherein the fifth end of the second conductive layer is positioned between the first end of the substrate and the sixth end of the second conductive layer in the first direction;
   wherein the seventh end of the piezoelectric body is positioned between the first end of the substrate and the eighth end of the piezoelectric body in the first direction;
   wherein the eighth end of the piezoelectric body is positioned between the fifth end of the second conductive layer and the sixth end of the second conductive layer in the first direction;
   wherein the eighth end of the piezoelectric body is positioned between the third end of the first conductive layer and the fourth of the first conductive layer in the first direction;
   wherein the fifth end of the second conductive layer is positioned between the seventh end of the piezoelectric body and the eighth end of the piezoelectric body in the first direction;
   wherein the fifth end of the second conductive layer is positioned between the third end of the first conductive layer and the fourth end of the first conductive layer in the first direction;
   wherein the second conductive layer comprises a portion extending from the fifth end of the second conductive layer toward the eighth end of the piezoelectric body along the first direction; and
   wherein the portion of the second conductive layer is located between the piezoelectric body and the substrate in the second direction.

2. The piezoelectric actuator according to claim 1;
   wherein the second conductive layer is formed of a conductive material which is harder than the first conductive layer.

3. The piezoelectric actuator according to claim 1;
   wherein the second conductive layer is formed of tantalum, tungsten, or iridium.

4. The piezoelectric actuator according to claim 1;
   wherein the second conductive layer is formed of the same conductive material as that of the wiring.

5. The piezoelectric actuator according to claim 1;
   wherein the second conductive layer is formed of a conductive material which does not contain any metallic element contained in the piezoelectric body.

6. The piezoelectric actuator according to claim 1;
   wherein the first conductive layer is positioned between the second conductive layer and the substrate in the second direction.

7. The piezoelectric actuator according to claim 1;
   wherein the second conductive layer is positioned between the first conductive layer and the substrate in the second direction.

8. The piezoelectric actuator according to claim 1;
   wherein the wiring has a ninth end which is connected to the first conductive layer and a tenth end which is electrically connected to a wiring member;
   wherein the wiring extends in the first direction from the ninth end to the tenth end;
   wherein a third conductive layer, which is formed of the same conductive material as that of the second conductive layer, is provided between the ninth end of the wiring and the tenth end of the wiring in the first direction; and
   wherein the third conductive layer is positioned between the wiring and the substrate in the second direction.

9. The piezoelectric actuator according to claim 8;
wherein the first conductive layer is positioned between the wiring and the substrate in the second direction;
wherein the second conductive layer extends in the first direction along the wiring; and
wherein the second conductive layer is in conduction with the third conductive layer.

10. The piezoelectric actuator according to claim 8;
wherein the third conductive layer has such a shape that the cross-sectional shape thereof is tapered in the second direction.

11. The piezoelectric actuator according to claim 1; further comprising:
an electrode at least partially overlapping with the substrate, the first conductive layer, and the piezoelectric body in the second direction, wherein the piezoelectric body is positioned between the first conductive layer and the electrode in the second direction;
wherein the first conductive layer has a small width portion between the third end of the first conductive layer and the fourth end of the first conductive layer in the first direction;
wherein the small width portion faces the electrode with the piezoelectric body intervening therebetween;
wherein the small width portion of the first conductive layer is narrower than the third end of the first conductive layer and the fourth end of the first conductive layer in a third direction which is along the planar direction of the substrate and orthogonal to the first direction; and
wherein the fifth end of the second conductive layer is arranged between the small width portion of the first conductive layer and the sixth end of the second conductive layer in the first direction.

12. The piezoelectric actuator according to claim 1;
wherein a cutout is formed on a side surface of the eighth end of the piezoelectric body.

13. The piezoelectric actuator according to claim 1, further comprising:
an electrode at least partially overlapping with the substrate, the first conductive layer, and the piezoelectric body in the second direction, wherein the piezoelectric body is positioned between the first conductive layer and the electrode in the second direction; and
a fourth conductive layer which is formed of the same material as that of the electrode and which is separated from the electrode;
wherein the fourth conductive layer overlaps with the eighth end of the piezoelectric body in the second direction; and
wherein the eighth end of the piezoelectric body is positioned between the fourth conductive layer and the second conductive layer in the second direction.

14. The piezoelectric actuator according to claim 1, further comprising:
an electrode at least partially overlapping with the substrate, the first conductive layer, and the piezoelectric body in the second direction, wherein the piezoelectric body is positioned between the first conductive layer and the electrode in the second direction;
wherein an auxiliary electrode, which is formed of the same material as that of the wiring and which is separated from the wiring, is provided to overlap with the electrode in the second direction; and
wherein the electrode is positioned between the auxiliary electrode and the piezoelectric body in the second direction.

15. A piezoelectric actuator comprising:
a substrate, the substrate having a first end and a second end in a first direction which is along a planer direction of the substrate;
a first conductive layer at least partially overlapping with the substrate in a second direction which is orthogonal to the planar direction of the substrate, the first conductive layer having a third end and a fourth end in the first direction;
a second conductive layer at least partially overlapping with the first conductive layer and the substrate in the second direction, the second conductive layer having a fifth end and a sixth end in the first direction;
a piezoelectric body at least partially overlapping with the substrate, the first conductive layer, and the second conductive layer in the second direction, the piezoelectric body having a seventh end and an eighth end in the first direction, wherein the first conductive layer is at least partially positioned between the piezoelectric body and the substrate in the second direction; and
a wiring connected to the first conductive layer;
wherein the third end of the first conductive layer is positioned between the first end of the substrate and the fourth end of the first conductive layer in the first direction;
wherein the fifth end of the second conductive layer is positioned between the first end of the substrate and the sixth end of the second conductive layer in the first direction;
wherein the seventh end of the piezoelectric body is positioned between the first end of the substrate and the eighth end of the piezoelectric body in the first direction;
wherein the eighth end of the piezoelectric body is positioned between the third end of the first conductive layer and the fourth end of the first conductive layer in the first direction;
wherein the fifth end of the second conductive layer is positioned between the seventh end of the piezoelectric body and the eighth end of the piezoelectric body in the first direction;
wherein the fifth end of the second conductive layer is positioned between the third end of the first conductive layer and the fourth end of the first conductive layer in the first direction;
wherein the second conductive layer comprises a portion extending from the fifth end of the second conductive layer toward the eighth end of the piezoelectric body along the first direction; and
wherein the portion of the second conductive layer is located between the piezoelectric body and the substrate in the second direction.

16. The piezoelectric actuator according to claim 15;
wherein the portion of the second conductive layer is positioned between the first conductive layer and the piezoelectric body in the second direction.

17. A piezoelectric actuator comprising:
a substrate, the substrate having a first end and a second end in a first direction which is along a planer direction of the substrate;
a first conductive layer at least partially overlapping with the substrate in a second direction which is orthogonal to the planar direction of the substrate, the first conductive layer having a third end and a fourth end in the first direction;
a second conductive layer at least partially overlapping with the first conductive layer and the substrate in the second direction, the second conductive layer having a fifth end and a sixth end in the first direction;

a piezoelectric body at least partially overlapping with the substrate, the first conductive layer, and the second conductive layer in the second direction, the piezoelectric body having a seventh end and an eighth end in the first direction, wherein the first conductive layer is at least partially positioned between the piezoelectric body and the substrate in the second direction; and a wiring connected to the first conductive layer;

wherein the third end of the first conductive layer is positioned between the first end of the substrate and the fourth end of the first conductive layer in the first direction;

wherein the fifth end of the second conductive layer is positioned between the first end of the substrate and the sixth end of the second conductive layer in the first direction;

wherein the seventh end of the piezoelectric body is positioned between the first end of the substrate and the eighth end of the piezoelectric body in the first direction;

wherein the eighth end of the piezoelectric body is positioned between the fifth end of the second conductive layer and the sixth end of the second conductive layer in the first direction;

wherein the fifth end of the second conductive layer is positioned between the seventh end of the piezoelectric body and the eighth end of the piezoelectric body in the first direction;

wherein the fifth end of the second conductive layer is positioned between the third end of the first conductive layer and the fourth end of the first conductive layer in the first direction;

wherein the second conductive layer comprises a portion extending from the fifth end of the second conductive layer toward the eighth end of the piezoelectric body along the first direction; and wherein the portion of the second conductive layer is located between the piezoelectric body and the substrate in the second direction.

18. The piezoelectric actuator according to claim 17;

wherein the first conductive layer is positioned between the portion of the second conductive layer and the piezoelectric body in the second direction.

\* \* \* \* \*